United States Patent [19]
Aoki et al.

[11] Patent Number: 5,629,539
[45] Date of Patent: May 13, 1997

[54] SEMICONDUCTOR MEMORY DEVICE HAVING CYLINDRICAL CAPACITORS

[75] Inventors: Masami Aoki, Yokohama; Tohru Ozaki, Tokyo; Takashi Yamada, Ebina; Hitomi Kawaguchiya, Yokohama, all of Japan

[73] Assignee: Kabushiki Kaisha Toshiba, Kawasaki, Japan

[21] Appl. No.: 400,887

[22] Filed: Mar. 8, 1995

[30] Foreign Application Priority Data

| Mar. 9, 1994 | [JP] | Japan | 6-038190 |
| Mar. 15, 1994 | [JP] | Japan | 6-043626 |
| Nov. 30, 1994 | [JP] | Japan | 6-297260 |

[51] Int. Cl.⁶ ............ H01L 27/108; H01L 29/94; H01L 31/119
[52] U.S. Cl. .................. 257/306; 257/302; 257/303; 257/304; 257/311
[58] Field of Search ........................ 257/296, 298, 257/301, 302, 303, 304, 305, 306, 311

[56] References Cited

U.S. PATENT DOCUMENTS

| 5,235,199 | 8/1993 | Hamamoto et al. |
| 5,248,628 | 9/1993 | Okabe et al. |
| 5,408,114 | 4/1995 | Kinoshita et al. ............ 257/306 |

FOREIGN PATENT DOCUMENTS

| 3-82155 | 4/1991 | Japan . |

*Primary Examiner*—Carl Whitehead, Jr.
*Attorney, Agent, or Firm*—Oblon, Spivak, McClelland, Maier & Neustadt, P.C.

[57] ABSTRACT

A semiconductor memory device comprises a semiconductor substrate, a plurality of memory cells including a plurality of MOS transistors, each having a source, a drain and a gate, and a plurality of capacitors formed on the semiconductor substrate in a matrix manner, an interlayer insulating film formed on the memory cells and having a plurality of openings selectively formed, a plurality of plug electrodes formed in the openings of the interlayer insulating film, a plurality of bit lines, each bit line being connected to one of the source and the drain of each of the MOS transistors through a corresponding one of the plug electrodes, and a plurality word lines, each word line being the gate of each of the MOS transistors. The capacitors each comprise a storage node electrode having a cylindrical portion layered on another one of the source and the drain of each of the MOS transistors, a capacitor dielectric film formed on the storage node electrode, and a plate electrode formed to be opposed to at least the storage node electrode interposing the capacitor dielectric film therebetween. The bit lines are formed on the interlayer insulating film and connected to the upper surface of the plug electrode. The plug electrode has a pad electrode comprised of a lower side conductive member formed with a same layer as the storage node electrode and a cylindrical side wall conductive member, and an upper side conductive member formed on the pad electrode.

25 Claims, 26 Drawing Sheets

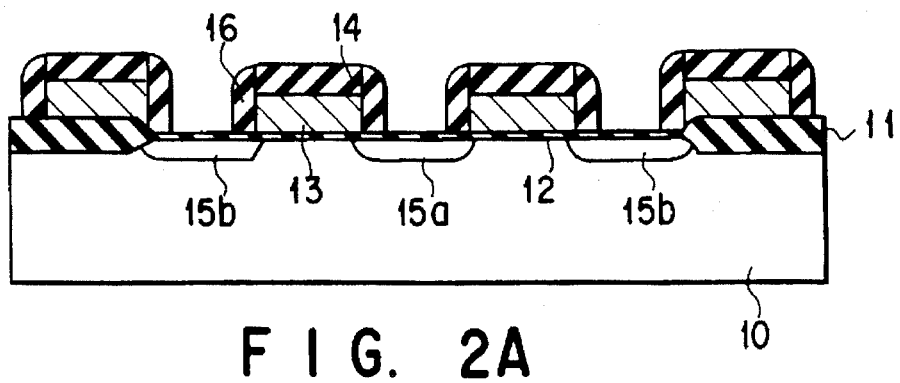
F I G. 2A
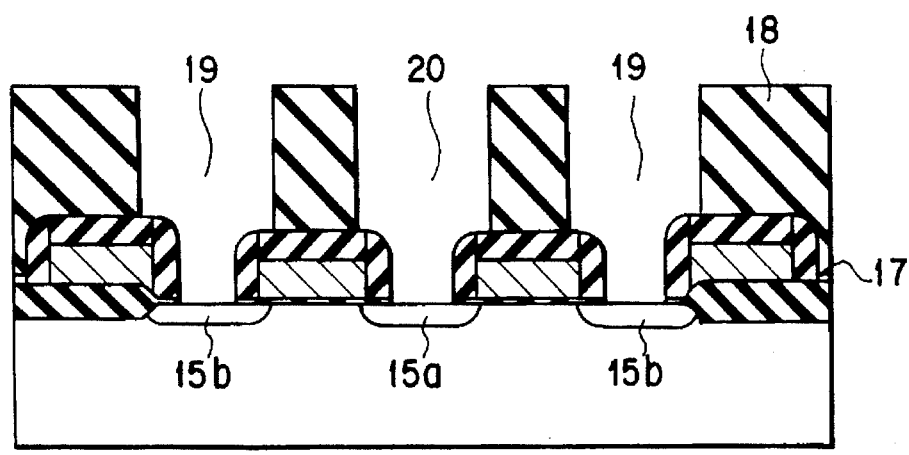
F I G. 2B
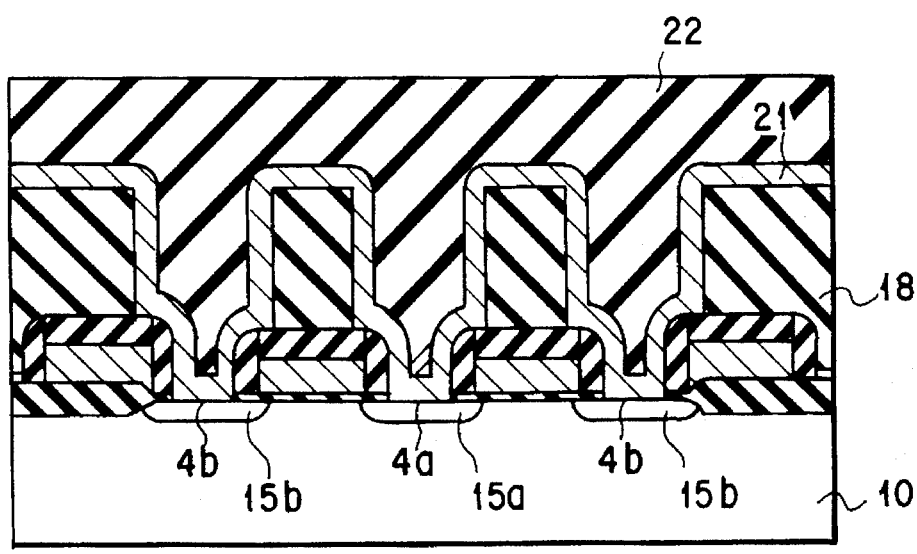
F I G. 2C

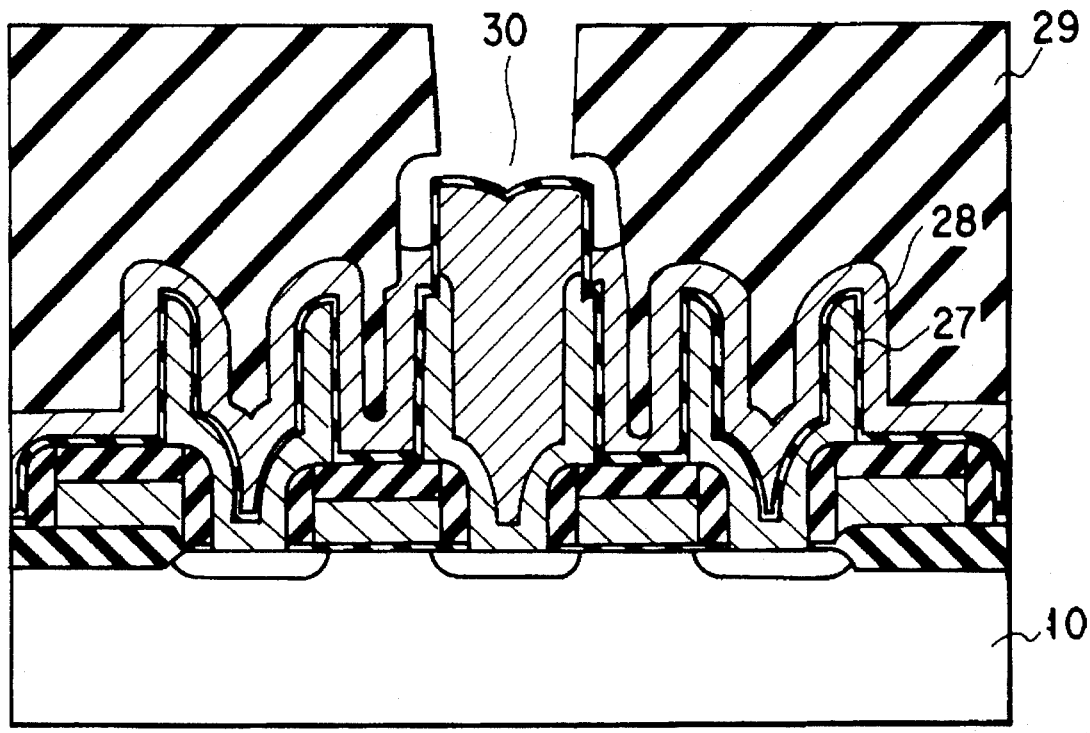
F I G. 2J
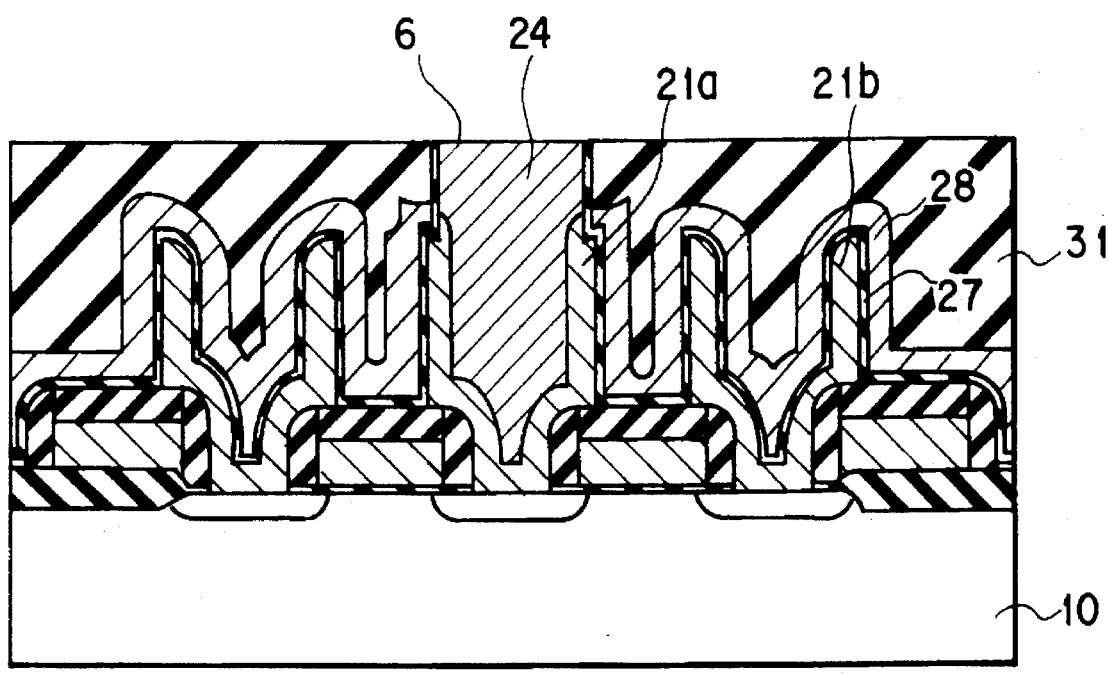
F I G. 2K

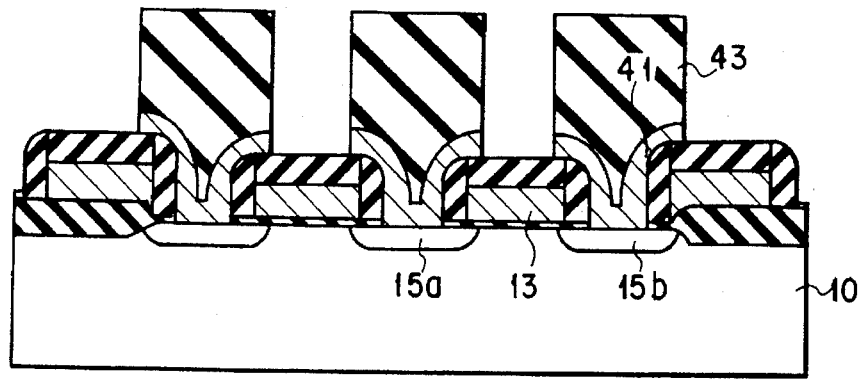
F I G. 6A
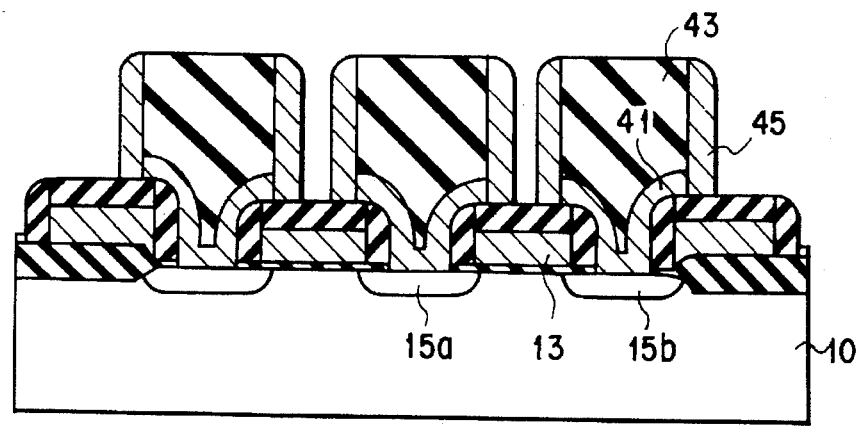
F I G. 6B
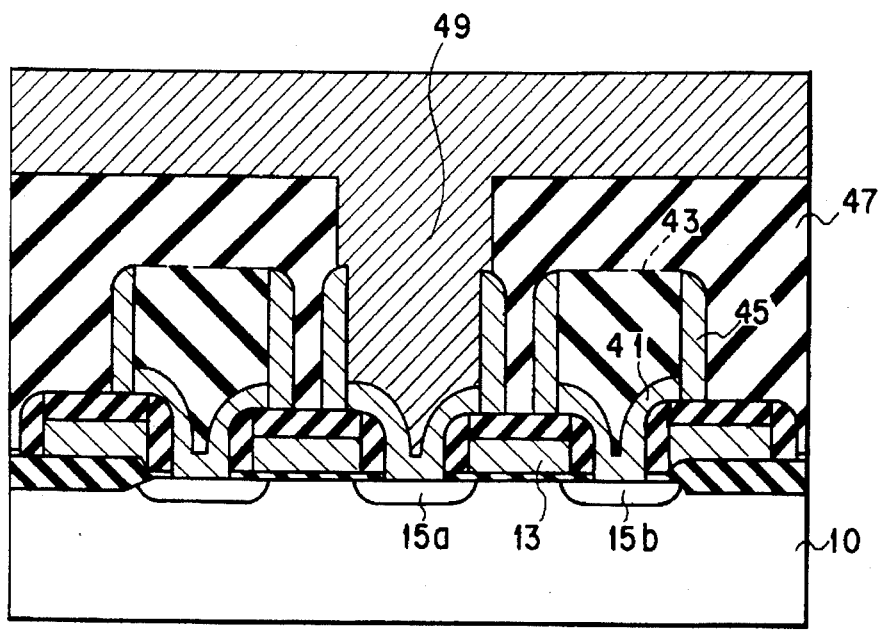
F I G. 6C

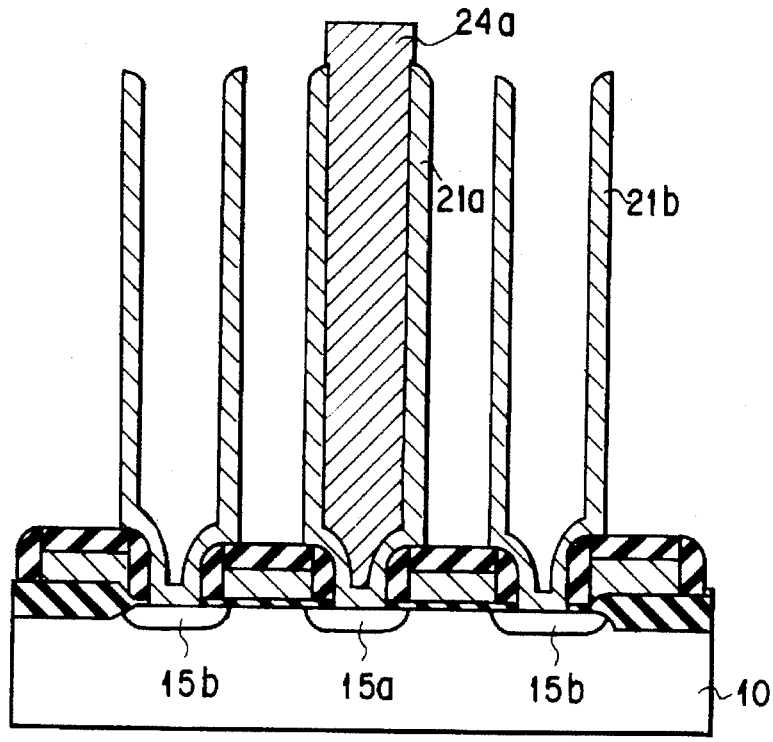
F I G. 7
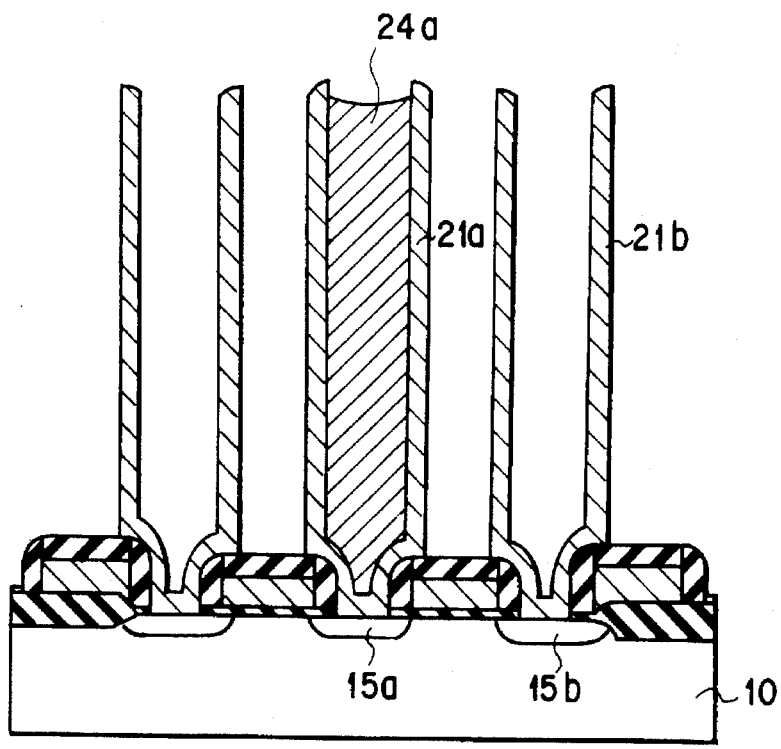
F I G. 8

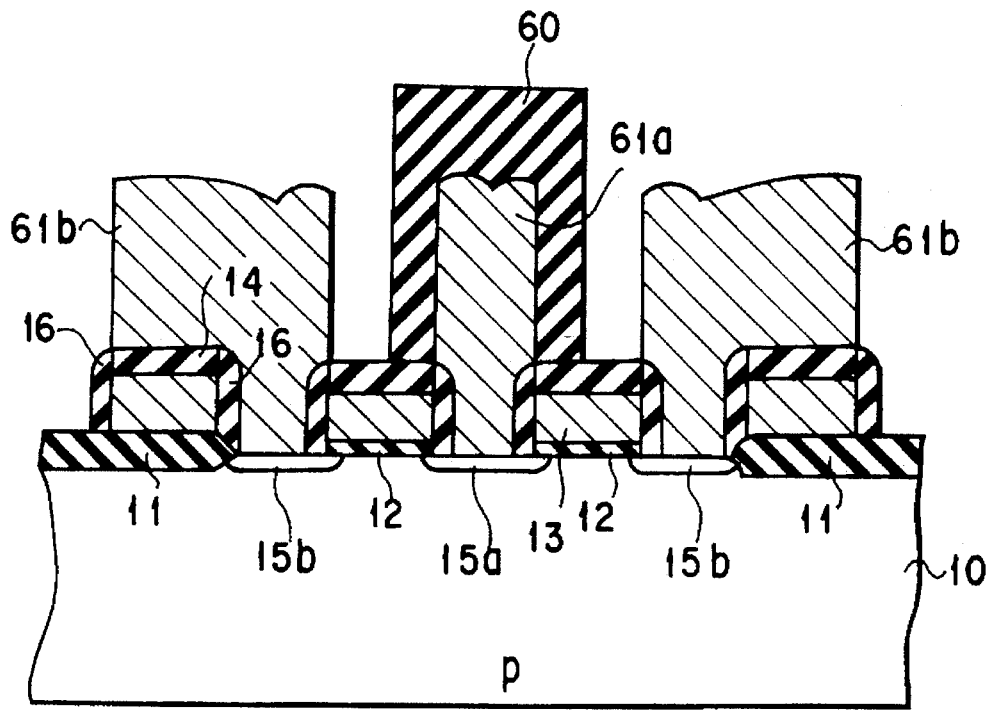
F I G. 12A
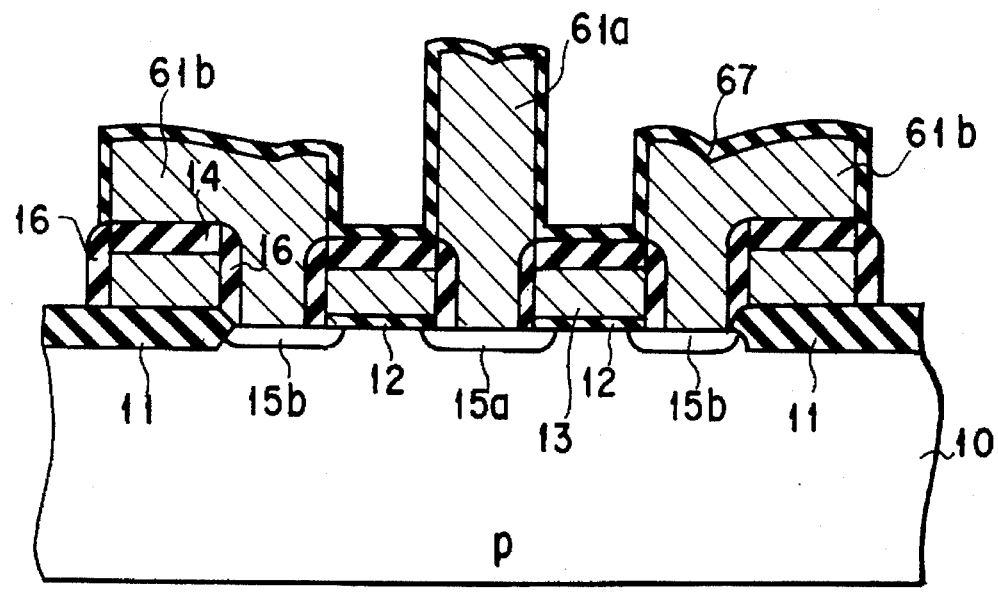
F I G. 12B

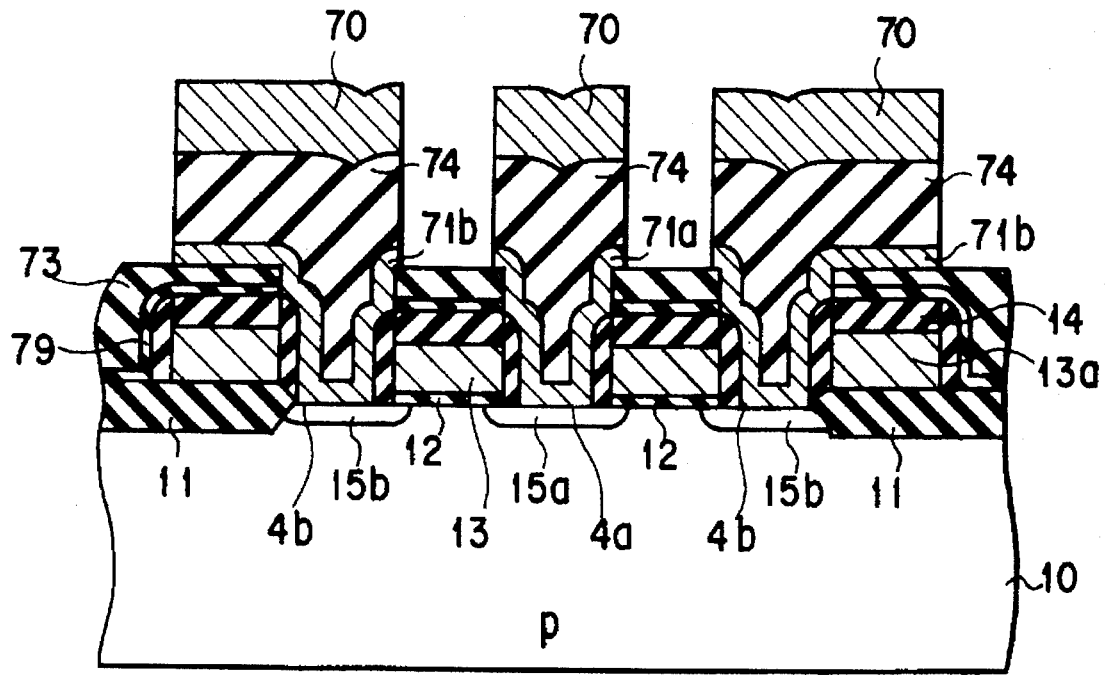
F I G. 15A
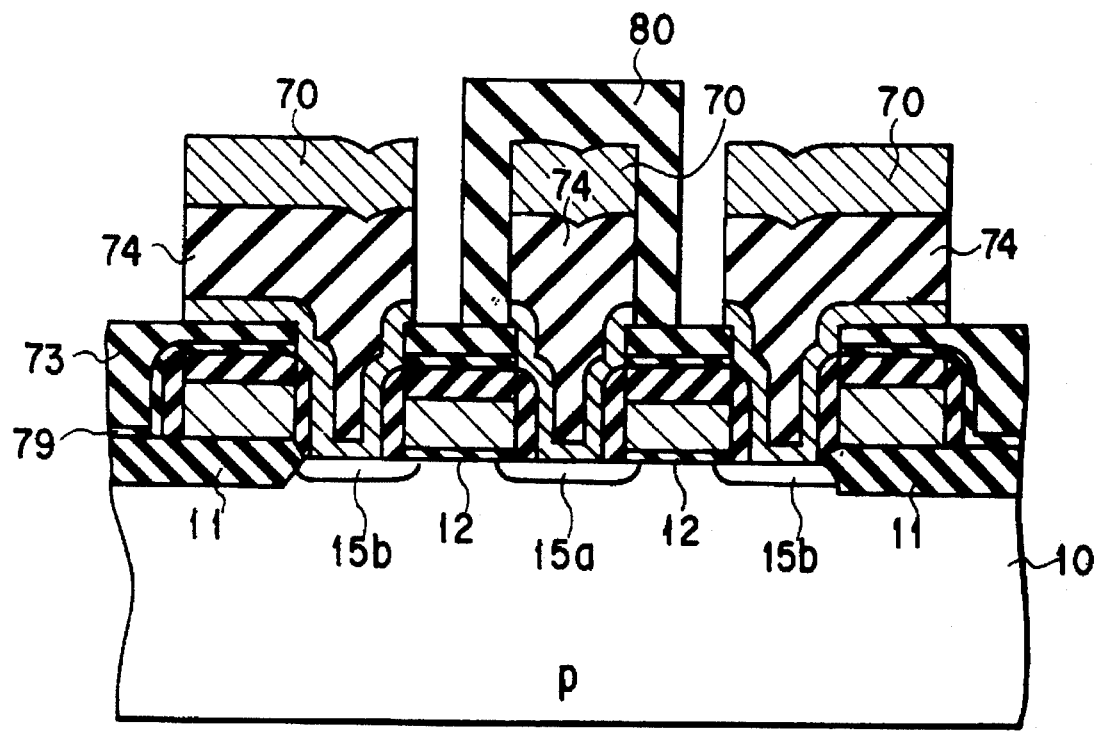
F I G. 15B

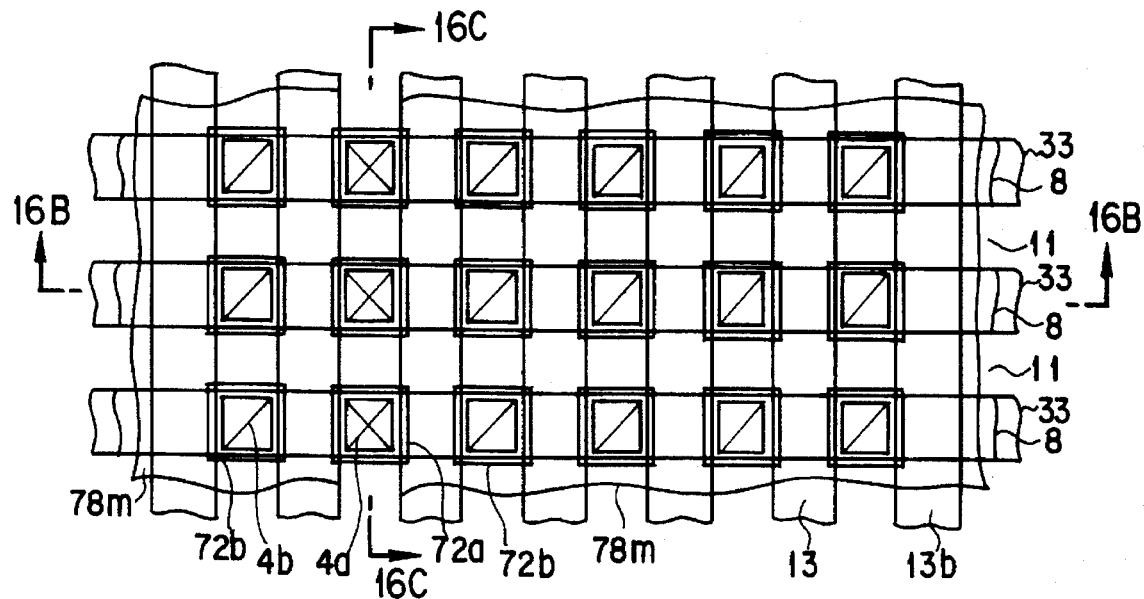
F I G. 16A
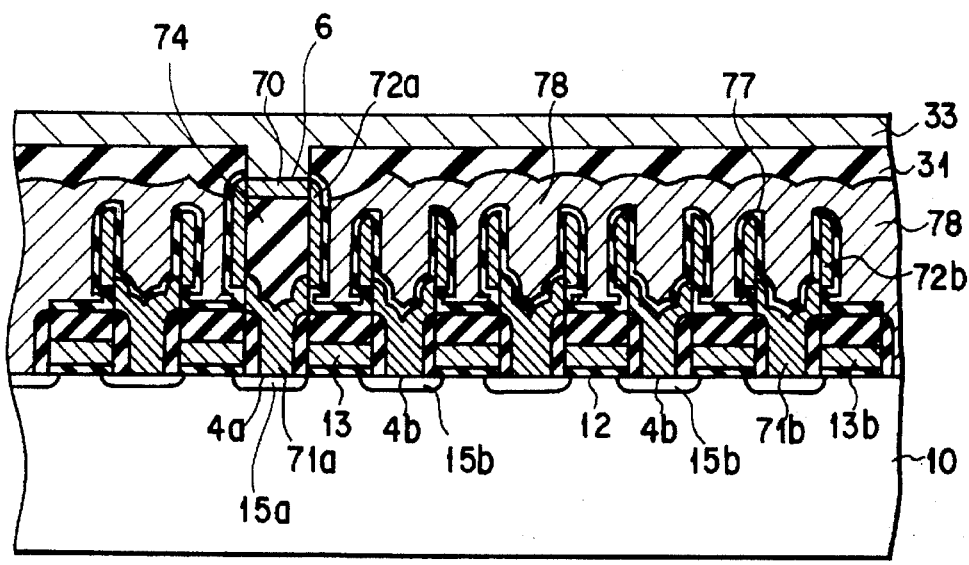
F I G. 16B

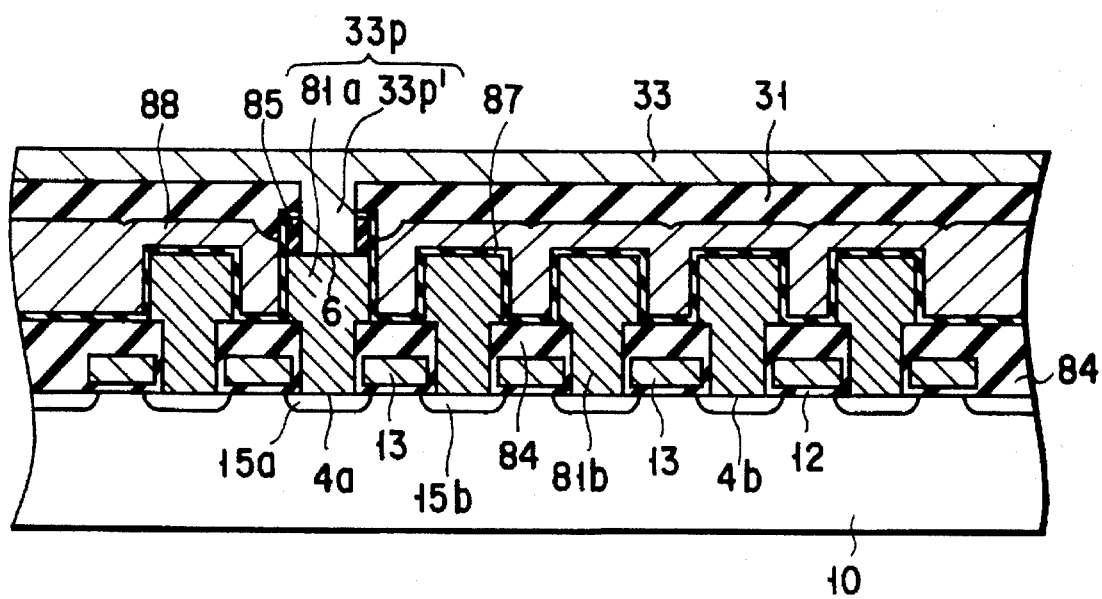
F I G. 17A
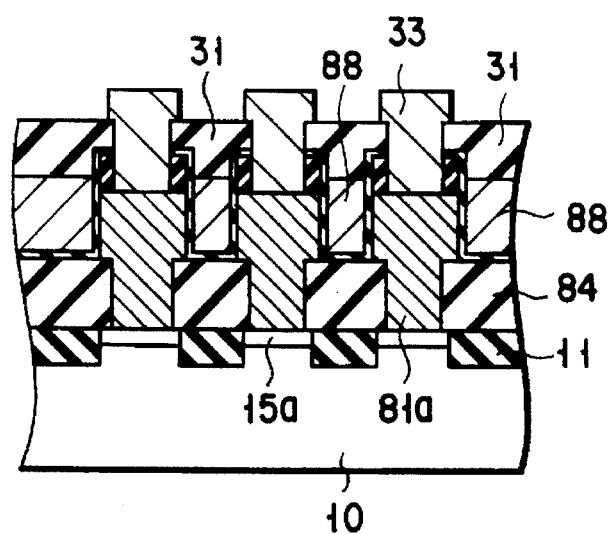
F I G. 17B

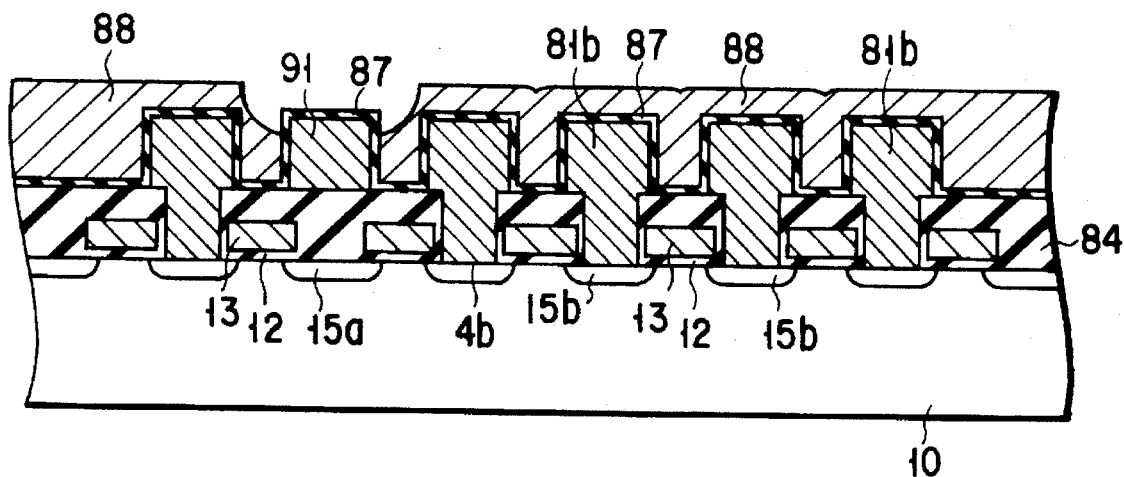
F I G. 23A
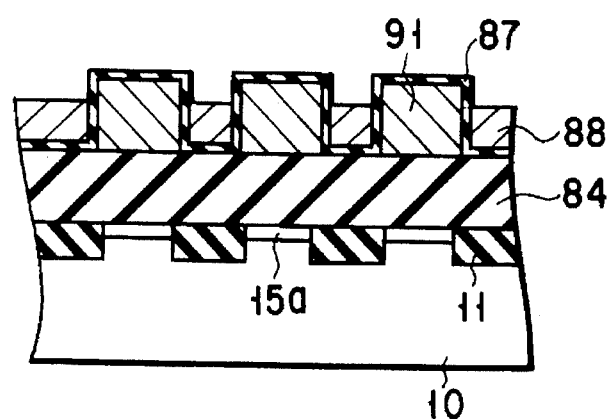
F I G. 23B

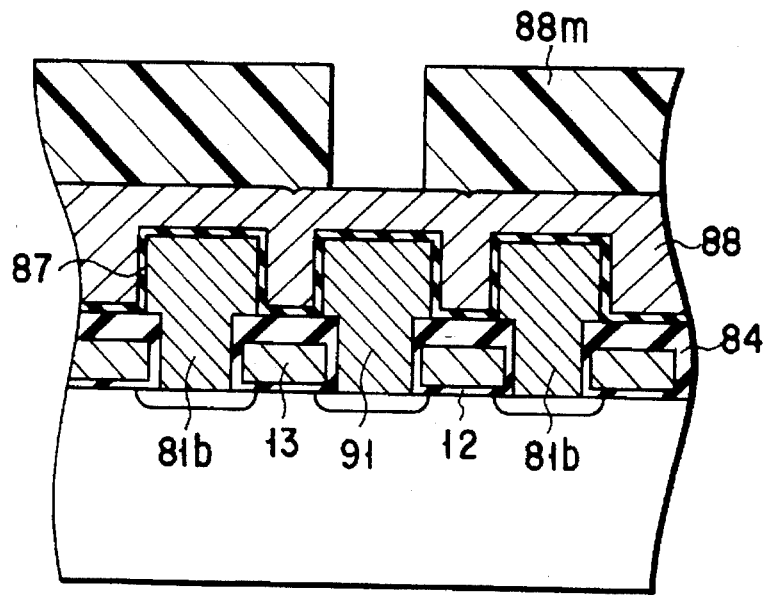
F I G. 25A
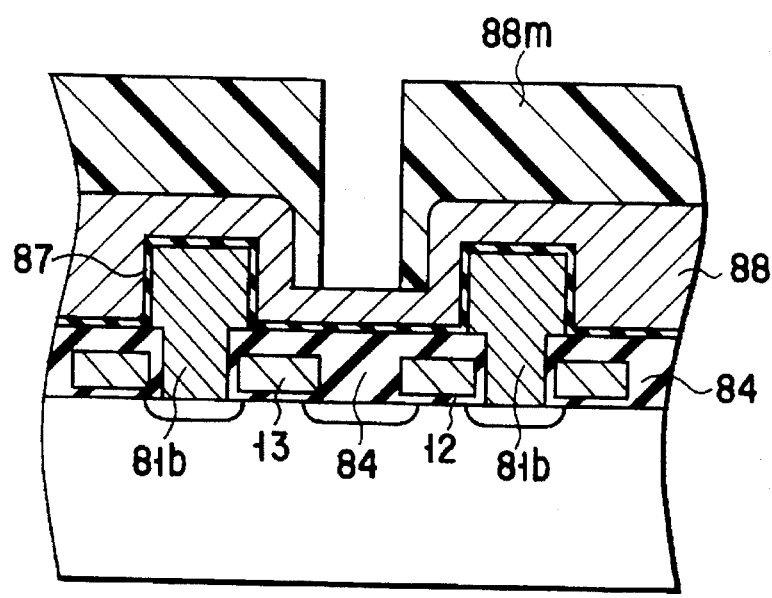
F I G. 25B

SEMICONDUCTOR MEMORY DEVICE HAVING CYLINDRICAL CAPACITORS

BACKGROUND OF THE INVENTION

1. Field of the Invention

The present invention relates to a semiconductor memory device and, more particularly to a semiconductor memory device of dynamic type (DRAM) having a memory cell comprising a transistor and a capacitor and method of manufacturing the same.

2. Description of the Related Art

In recent years, an area of a capacitor for electrical charge (data) has been fined in accordance with the advance of the integration of a semiconductor integrated circuit such as a DRAM. In this way, if the area of the capacitor is reduced, capacitance is reduced. As a result, there occurs a problem in the point of a software such as the contents of the memory are erroneously read or the contents of the memory are broken by an α ray.

In order to solve the above problem, there is proposed the so-called stacked capacitor structure which a MOS capacitor is stacked on a memory cell area. According to the stacked capacitor structure, a node electrode is enlarged on an isolation area, and a thickness of the electrode is increased to be box-shaped or pedestal-shaped. Whereby, the side area of the electrode can be three-dimensionally used as an area of the capacitor. Due to this, capacity, which is several times as large as a planar structure, can be obtained.

However, even in the DRAM having such a box-shaped stacked capacitor structure, since a memory cell occupied area is reduced in accordance with the advance of fining the element, it is required that the effective height of the storage node electrode be increased so as to obtain sufficient capacitance. To satisfy such a requirement, there is proposed the so-called crown structure in which the storage node electrode is cylindrically shaped to increase the area of the capacitor more. According to the crown structure, the height of the storage electrode can be set to about ⅔ of the case of the box structure in a state that the same capacitance is used. Moreover, capacitance can be set to about 1.5 times as the case of the box structure in a state that the same occupied area is used. Due to this, the use of the crown structure has been increased in the DRAM in which the enlargement of the capacity is advanced.

In any case, if the stacked capacitor structure is used, a contact path of a bit line, which is formed through an interlayer insulating film, must be deeply formed in order to connect the bit line, which is formed on the interlayer insulating film, to a wire of a lower layer of a memory cell area. Due to this, there were problems in which the formation of a contact hole becomes difficult and short-circuiting is easily generated in the vicinity of the wire of the lower layer due to over-etching.

In order to solve the above problems, there is proposed the structure in which a pad electrode having the same structure as the storage node electrode is provided in a bit line contact portion and used as a plug, whereby the depth of the contact path of the bit line is decreased (for example, Japanese Patent Application KOKAI Publication No. 3-82155). This structure is useful for the case that the box-shaped pad electrode is used. However, in a case where the pad electrode having the same structure as the cylindrical (crown) typed storage node electrode is used, the following problems will be brought about.

More specifically, if the plate electrode, serving as a pad electrode and covering the capacitor dielectric film, is formed on the cylindrical storage node electrode interposing the capacitor dielectric film therebetween and the plate electrode of the top portion of the cylindrical electrode and the capacitor dielectric film are selectively removed and the upper surface of the storage node electrode, serving as a plug, is exposed, the bit line contact area, which is electrically connected to the bit line, can be formed, but the contact resistance is increased since the contact area is small. Moreover, since the cylindrical pad electrode is used as a plug, the resistance of the plug is increased. Therefore, the resistance of the bit line contact path is more increased, and this exercises an unfavorable influence on the read/write operation.

Moreover, if materials, which have a higher dielectric constant than conventional SiN film and a SiN/SiO$_2$ layer film, such as Ta$_2$O$_5$, PZT (lead zirconate titanate), BaSrTiO$_3$, SrTiO$_3$ are used as the capacitor dielectric film, the following problem occurs.

More specifically, if these high dielectric film are used, metallic films such as TiN, Pt, W etc. are needed as electrodes thereof. However, since these materials cannot easily be processed with a sufficient selection ratio to the storage node electrode (for example, polysilicon is used) in selective etching, it basically becomes difficult to expose the storage node electrode.

As mentioned above, in the DRAM of the stacked capacitor memory cell structure, in the case that the cylindrical storage node structure was used, there was difficulty in forming the bit line contact in which the storage node electrode is used as a plug.

On the other hand, there is a problem in the plate electrode, which is formed on the upper portion of the storage node electrode with the capacitor dielectric film intervening therebetween. The plate electrode, which is formed around the pad electrode, is removed by etching to prevent the plate electrode from being short-circuited with the bit line contact path. In this case, there was often case in which even a part of the adjacent storage node electrode is exposed by etching and the reduction of capacitance is brought about.

Moreover, in a case where the bit line contact areas are closely formed similar to the NAND type DRAM, a groove can be formed in the surface of the plate electrode along the contact array formed by the adjacent bit line contact areas if the plate electrode around the bit line contact paths are removed by etching. As a result, the plate electrode is divided into two. In the case of the DRAM of an open bit arrangement such as an NAND type DRAM, a potential difference is generated depending on the location of the memory cell area if the plate electrode is not integrally formed, or wiring resistance exists in the plate electrode. As a result, since large noise is generated at the time of reading and writing data, and an erroneous operation occurs, it was needed that the potential of the plate electrode be fixed constant as possible.

SUMMARY OF THE INVENTION

An object of the present invention is to provide a semiconductor memory device having a stacked capacitor structure, which can realize sufficient capacitance, a bit line contact having a low resistance, and a plate electrode having a low resistance, and manufacturing method thereof.

In order to obtain the above object, the present invention uses the following structure and the manufacturing method.

More specifically, according to a first aspect of the present invention, there is provided a semiconductor memory device comprising: a semiconductor substrate; a plurality of memory cells including a plurality of MOS transistors, each having a source, a drain and a gate, and a plurality of capacitors formed on the semiconductor substrate in a matrix manner, the capacitors each comprising: a storage node electrode having a cylindrical portion layered on another one of the source and the drain of each of the MOS transistors; a capacitor dielectric film formed on at least the storage node electrode; and a plate electrode formed to be opposed to at least the storage node electrode interposing the capacitor dielectric film therebetween; an interlayer insulating film formed on the memory cells and having a plurality of openings selectively formed; a plurality of plug electrodes formed in the openings of the interlayer insulating film; and a plurality of bit lines, each bit line being connected to one of the source and the drain of each of the MOS transistors through a corresponding one of the plug electrodes, and a plurality word lines, each word line being the gate of each of the MOS transistors, the bit lines formed on the interlayer insulating film and connected to upper surfaces of the plug electrodes through the openings so as to bury upper portions thereof respectively, the plug electrode each having a pad electrode comprised of a lower side conductive member formed with a same layer as the storage node electrode and a cylindrical side wall conductive member, and an upper side conductive member formed on the pad electrode.

According to a second aspect of the present invention, there is provided a method for manufacturing a semiconductor memory device comprising the steps of: forming a plurality of MOS transistors on a semiconductor substrate; forming a first insulating film on the substrate where the MOS transistors are formed; selectively removing the first insulating film to expose source and drain regions of the MOS transistors and to form a plurality of storage node contact holes and a bit line contact hole, thus forming a first bit line contact area therein; continuously forming a first conductive film on a surface of the first insulating film and an inner surface of the two kinds of contact holes; forming a second insulting film to embed the first conductive film; selectively removing the second insulating film above and in the bit line contact hole to form an opening, thus exposing the first conductive film; filling the opening with conductive material; forming a plug electrode composed of the first conductive film and the conductive material on the first bit line contact area, and a storage node electrodes composed of the first conductive film in the storage node contact holes, by etching back the second insulating film up to at least a level of a top surface of the first insulating film to expose a top portion of the first conductive film and selectively removing the top portion thereof; sequentially layering a capacitor dielectric film and a plate electrode on an entire surface of the substrate after removing a residual of the second insulating film and the first insulating film; removing the plate electrode around a head portion of the conductive material and the capacitor dielectric film of a top surface of the conductive material to form a second bit line contact area; forming an opening to expose the second bit line contact area after forming an interlayer insulting film on the entire surface; and forming a bit line on the interlayer insulating film to be connected to the second bit line contact area.

According to a third aspect of the present invention, there is provided a semiconductor memory device comprising: a semiconductor substrate; a plurality of memory cells including a plurality of MOS transistors, each having a source, a drain and a gate, and a plurality of capacitors formed on the semiconductor substrate in a matrix manner, the capacitors each comprising: a storage node electrode having a cylindrical portion layered on another one of the source and the drain of each of the MOS transistors; a capacitor dielectric film formed on at least the storage node electrode; and a plate electrode formed to be opposed to at least the storage node electrode interposing the capacitor dielectric film therebetween; an interlayer insulating film formed on the memory cells and having a plurality of openings selectively formed; a plurality of plug electrodes respectively formed in the openings of the interlayer insulating film; and a plurality of bit lines, each bit line connected to one of the source and the drain of each of the MOS transistors through a corresponding one of the plug electrodes and a plurality word lines, each word line being the gate of each of the MOS transistors, the bit lines being formed on the interlayer insulating film and connected to top surfaces of the plug electrodes through the openings so as to bury upper portions thereof respectively, the plug electrodes each being formed with a same layer as the storage node electrode at a bottom portion and a side wall thereof, and selectively connected to one of the source and the drain of the MOS transistors thereby, wherein each top surface of the plug electrodes is positioned to be higher than a top surface of the storage node electrode.

According to a fourth aspect of the present invention, there is provided a method for manufacturing a semiconductor memory device comprising the steps of forming a plurality MOS transistors on a semiconductor substrate; forming a first insulating film on gate electrodes of the transistors; forming a first conductive film on an entire surface of the substrate to be connected to source and drain regions of the transistors, a first bit line contact area and storage node contact areas; sequentially forming a second insulating film and a second conductive film on the first conductive film to form a three-layer film; selectively etching the three-layer film to form three-layer film blocks on the first bit line contact area and the storage node contact areas, the three-layer blocks each having an extended top area at least larger than a corresponding one of the contact areas; removing the second conductive film of each of the three-layer film blocks on the storage node contact areas to form a two-layer film blocks; forming a third conductive film on the entire surface of the substrate to leave the third conductive film on side walls of the three-layer film block and the two-layer film blocks by means of anisotropic etching; removing the second insulating film of upper portions of the storage node contact area; layering a capacitor dielectric film on the surface of the substrate followed by forming openings above the second conductive film of the three-layer block, thereby forming a second bit line contact area; layering a plate electrode on the entire surface of the substrate followed by etching back around the three-layer block to expose head portion thereof; forming an interlayer insulating film on the entire surface of the substrate to open the second bit line contact area to be exposed; and forming a bit line on the interlayer insulating film to be connected to the second bit line contact area. According to the present invention, the plug electrode can be formed in the bit line contact area in the same layer as the storage node electrode. Due to this, even if the level of the storage node is increased, the level of the plug electrode can be increased at the same time. Since the bit line contact is formed on the plug electrode, the bit line contact can be easily formed. Also, even if the plate electrode is processed to prevent the plate electrode and the bit line contact path from being short-circuited, there does not occur a case in which the storage node electrode is exposed to reduce capacitance. Moreover, there does not occur a case in which wiring resistance of the plate electrode is increased.

Furthermore, in a case where the inside of the plug electrode is filled with conductive material, contact resistance with the bit line and the resistance of the plug itself can be reduced. Whereby, sufficient capacitance and favorable bit line contact can be realized.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 2A to 2K are cross sectional views of a memory cell showing a manufacturing process of the first embodiment stepwise;

FIGS. 6A to 6C are cross sectional views of a memory cell showing a manufacturing process of a third embodiment stepwise;

FIGS. 7 to 10 are cross sectional views of a memory cell showing a modification of the first or third;

FIGS. 12A and 12B are cross sectional views of a memory cell showing a manufacturing process of the fourth embodiment stepwise;

FIGS. 15A to 15D are cross sectional views of a memory cell showing a manufacturing process of the fourth embodiment stepwise;

FIG. 16A is a plan view schematically showing an NAND type DRAM cell of a seventh embodiment of the present invention;

FIG. 16B is a cross sectional view taken along a line 16B—16B of FIG. 16A;

FIG. 17A is a cross sectional view taken along a bit line of an NAND type DRAM cell of an eighth embodiment of the present invention;

FIG. 17B is a cross sectional view of a bit line contact portion of the eighth embodiment in a direction perpendicular to the bit line;

FIG. 18A is a cross sectional view of the memory cell taken along the bit line, and FIG. 18B is a cross sectional view of a bit line contact portion in a direction perpendicular to the bit line;

FIG. 19A is a cross sectional view of the memory cell taken along the bit line, and FIG. 19B is a cross sectional view of a bit line contact portion in a direction perpendicular to the bit line;

FIG. 21A is a cross sectional view of the memory cell along the bit line, and FIG. 21B is a cross sectional view of a bit line contact portion in a direction perpendicular to the bit line;

FIGS. 23A and 23B, and 24A and 24B are views showing a manufacturing process of the tenth embodiment stepwise, FIGS. 23A and 24A are cross sectional views of a memory cell taken along a bit line, and FIGS. 23B and 24B are cross sectional views of a bit line contact portion in a direction perpendicular to the bit line;

FIGS. 25A and 25B are views showing the use of a pad, FIG. 25A is a cross sectional view showing a case in which the pad is used, and FIG. 25B is a cross sectional view showing a case in which the pad is not used;

DETAILED DESCRIPTION OF THE PREFERRED EMBODIMENTS

Figure 1A:
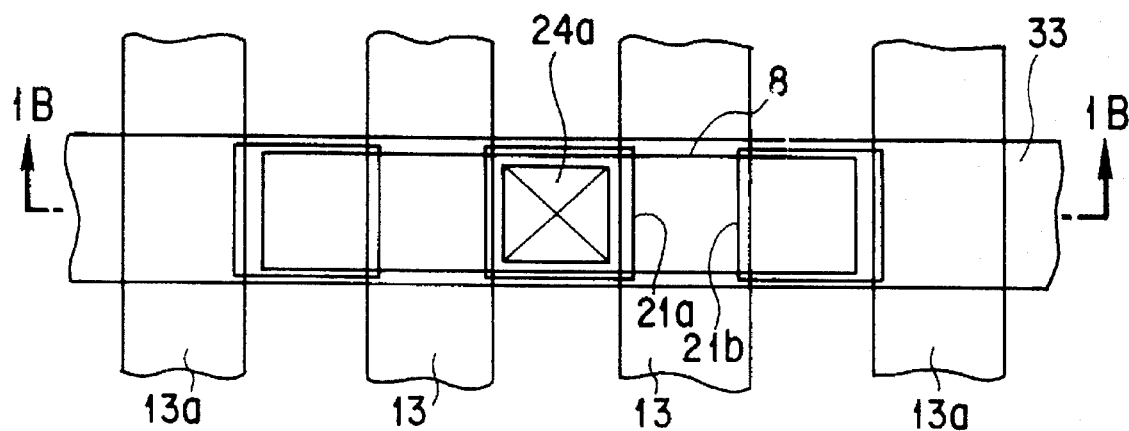
FIG. 1A is a plane view schematically showing an outline of a DRAM cell of a first embodiment of the present invention.

Embodiments of the present invention will be explained with reference to the drawings. The same reference numerals are given to the same portions through the following embodiments to avoid the redundancy of the explanation.

First Embodiment

Figure 1B:
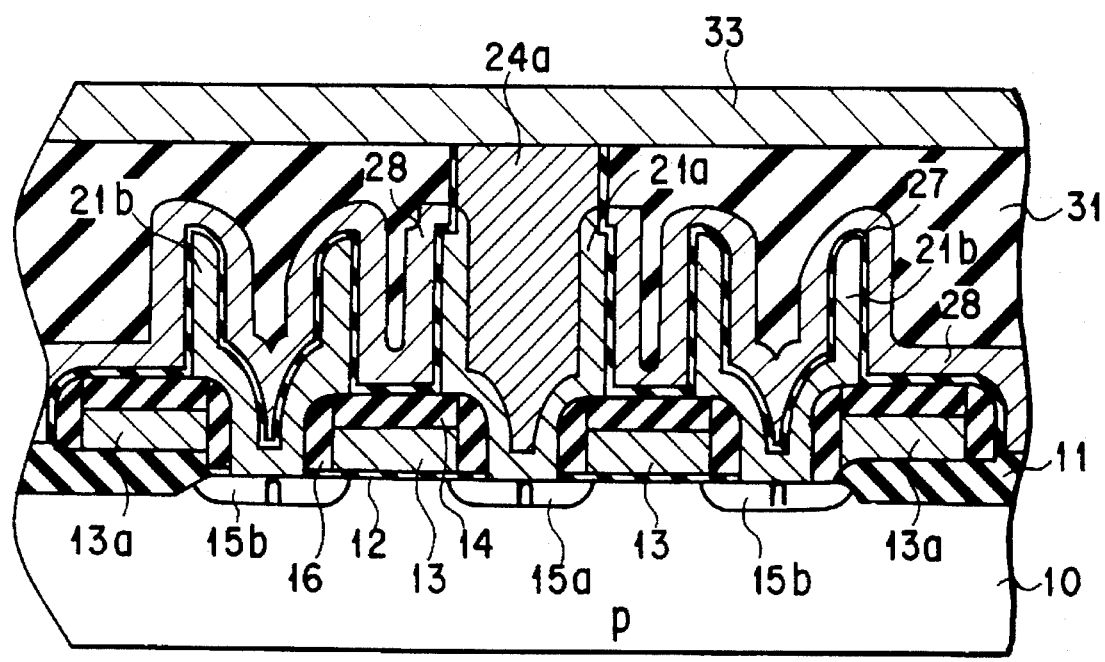
FIG. 1B is a cross sectional view taken along a line 1B—1B of FIG. 1A.

Generally, memory cells of the DRAM comprise a pair of a MOS transistor and a capacitor, and are provided in a memory cell forming area on a semiconductor substrate in a matrix manner (rows and columns directions). Each memory cell is connected to one of a plurality of bit lines arranged in parallel in a column direction, and connected to one of a plurality of word lines arranged in parallel in a row direction. FIG. 1A is a plan view schematically showing DRAM cells for two bits adjacent to each other in a direction of a bit line in the form that the mask drawings are overlapped on each other. FIG. 1B is a cross sectional view taken along a line 1B—1B. This embodiment provides the improved structure of a DRAM memory cell having a cylindrical capacitor.

In FIG. 1B, a gate electrode 13, which is formed of polycrystalline silicon with a gate insulating film 12 intervening therebetween, is formed on an element area 8 surrounded by an element separation area 11 of a p-type Si substrate 10. Silicon nitride films 14 and 16 are formed on upper and side portions of the gate electrode 13. N-type diffusion layers 15a and 15b, serving as source and drain regions, are formed on the substrate surface adjacent to the gate electrode 13. Thereby, the MOS transistor is structured. The gate electrode 13 extends in a perpendicular direction to the drawing paper, and is used as a word line. A structure 13a similar to the gate electrode 13 formed on the element separation area 11 is a passing word line for memory cells adjacent to each other in a perpendicular direction to the drawing paper.

A cylindrical storage node electrode 21b, serving as one electrode of the capacitor, is formed on the n-type diffusion layer 15b to be mounted on the adjacent gate electrode 13 and the passing word line 13a. Moreover, a pad electrode 21a for a bit line contact, which has the same structure as the storage node electrode 21b, is formed on the n-type diffusion layer 15b. A conductive material 24a is embedded in the pad electrode 21a to form a plug electrode. The conductive material 24a is projected to an upper position than an upper end of the pad electrode 21a. A capacitor dielectric film 27 is formed on the surface of the plug electrode (21a+24a) excepting the upper surface of the conductive material 24a, and a plate electrode 28 is formed thereon. An interlayer insulting film 31 is formed to flatten the embedding surface of each portion, and a bit line 33 is formed on the interlayer insulating film 31 to be connected to the conductive material 24a.

According to this embodiment, the cylindrical node electrode 21b and the pad electrode 21a are formed at the same time, and conductive material 24a such as polysilicon is embedded in the pad electrode 21a, so that a plug electrode is formed. Thereafter, the bit line 33 is electrically conducted to the plug electrode at a portion which is higher than the uppermost surface of the plate electrode 28. In this way, the bit line contact is formed in the cylindrical plug electrode in which the inside of the cylindrical pad electrode 21a is embedded with conductive material 24a, whereby a large contact area can be obtained, contact resistance can be reduced, and resistance of the plug electrode can be reduced. Moreover, the position of the upper surface of the uppermost embedded conductive material 24a is formed to be higher than the uppermost surface of the plate electrode 28, whereby there is no need that the plate electrode 28 around the pad electrode 21a is removed by etching. Therefore, there is no problem of the decrease in capacitance and the increase in wiring resistance of the plate electrode.

The following will explain the manufacturing method of the DRAM cell of the present invention with reference to FIGS. 2A to 2K.

First, as shown in FIG. 2A, a field oxide film 11 was formed on the surface of the p-type silicon substrate 10 having resistivity of about 5 $\Omega$·cm by a normal LOCOS (local oxidation of silicon). Thereafter, the gate insulation film 12, made of silicon oxide film having a thickness of about 10 nm, was formed. Moreover, the first polycrystalline silicon film having a thickness of about 150 nm and the silicon nitride film 14 having a thickness of about 150 nm were deposited thereon, and the gate electrode 13 was formed by use of lithography and RIE (reactive ion etching).

Then, the gate electrode 13 was used as a mask, and As or P ion was ion-implanted therein, so that the n-type diffusion layers 15a and 15b, serving as source and drain regions, were formed. Moreover, the silicon nitride film 16 having a thickness of about 100 nm was deposited on the entire surface, the entire surface was etched by RIE, so that a side wall insulating film 16 was left on a side wall of the gate electrode 13 in a self-aligning manner.

Next, as shown in FIG. 2B, a thick silicon nitride film 17 was deposited on the entire surface, and a SiO$_2$ film or a BPSG film was deposited to have a thickness of, e.g., 300 nm to 1000 nm, so that a first interlayer insulating film 18 was formed. The level of the capacitor electrode was determined by the thickness of the insulating film 18. Sequentially, a storage node contact hole 19 and a first bit line contact hole 20 were simultaneously formed in the insulating film 18 by use of RIE.

Next, as shown in FIG. 2C, a second polycrystalline silicon film 21 was deposited on the entire surface, and doped by use of P or As. Thereby, the n-type diffusion layers 15a and 15b and the polycrystalline silicon film 21 were connected, and a first bit line contact area 4a and a storage node contact area 4b were formed. Moreover, a second interlayer insulating film 22 was deposited thereon, and the surface was flattened. As the interlayer insulating film 22, SiO$_2$ or BPSG may be used.

Figure 2D:
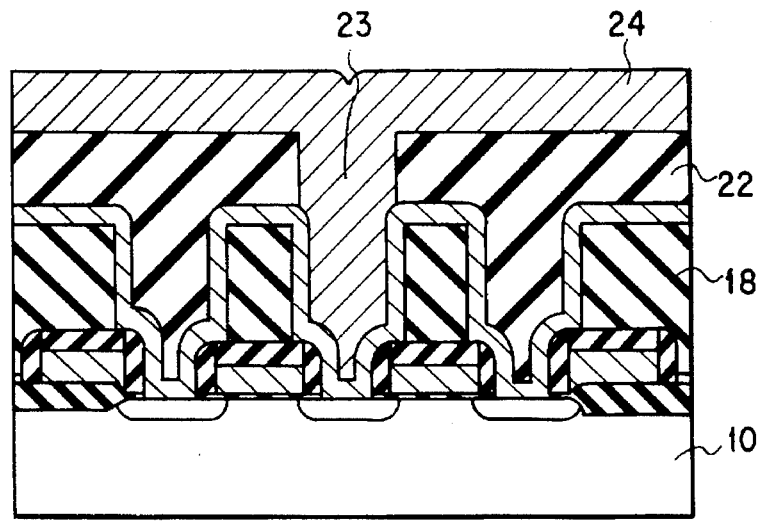

As shown in FIG. 2D, a second bit line contact hole 23 was formed in the bit line contact section of the interlayer insulating film 22 again, and a third polycrystalline silicon film 24 was deposited thereon to bury the hole.

Figure 2E:
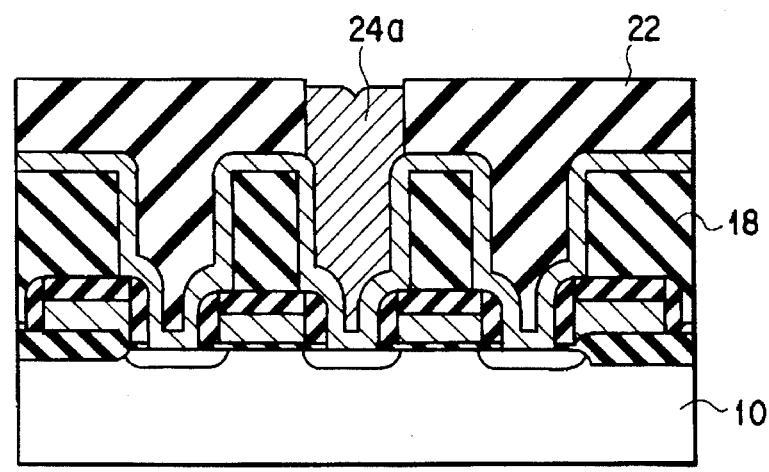

As shown in FIG. 2E, the entire surface of the third silicon film 24 was etched back, so that the polycrystalline film (conductive material) 24a was left only in the contact hole 23. The polycrystalline film 24a left in the contact hole 23 is used as a part of the plug electrode later. The polycrystalline film was used as conductive material, but metal such as W, Ti, Al, etc. or a compound such as WSi, TiSi, etc, or conductive material having a layered structure may be used.

Figure 2F:
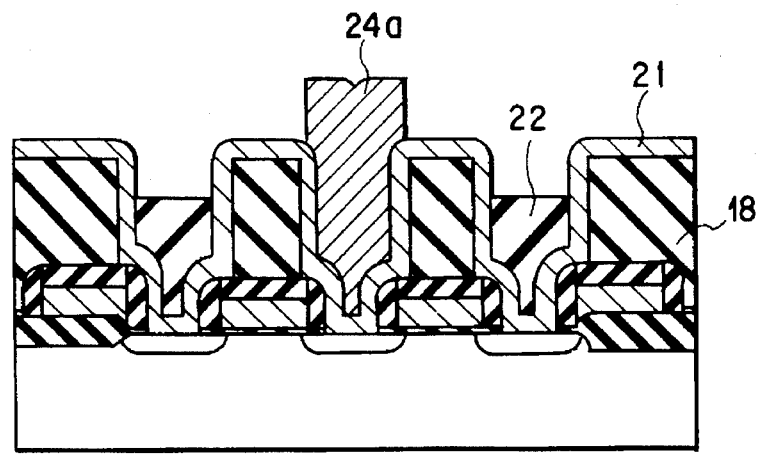

As shown in FIG. 2F, the entire surface of the second interlayer insulating film 22 was etched back, the insulating film 22 was left in a recess of the upper portion of the storage node contact section, and the surface of the second polycrystalline silicon film 21 was exposed. Etching back may be performed by means of RIE or isotropic etching such as wetting method.

Figure 2G:
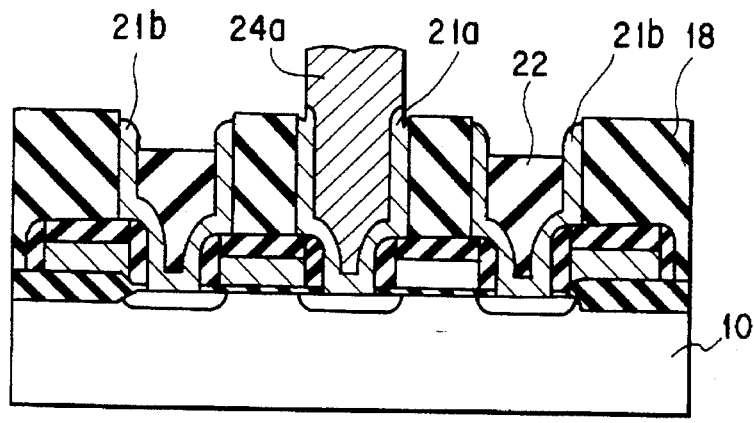

As shown in FIG. 2G, the entire surface of the second polycrystalline silicon film 21 was etched back by means of RIE. As a result, the polycrystalline silicon film 21 was separated on the first interlayer insulating film 18, so that the cylindrical storage node electrode 21b was formed. At the same time, the pad electrode 21a for bit line contact was separated and formed.

Figure 2H:
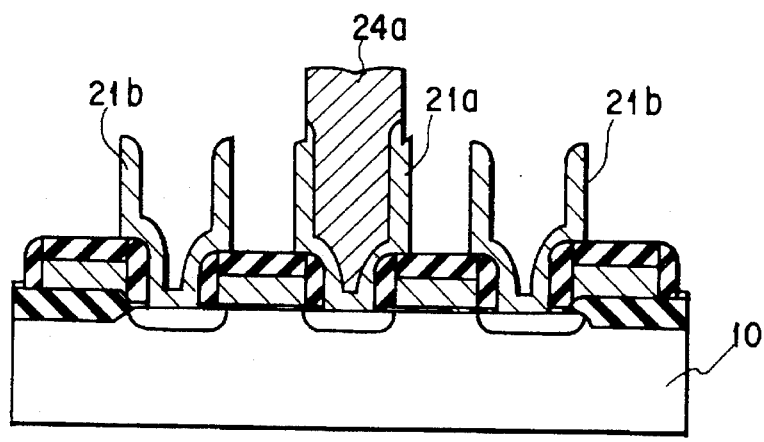

As shown in FIG. 2H, the first interlayer insulating film 18 was entirely removed by use of wet etching. At this time, the storage node electrode 21b and the plug electrode (21a+24a) were completed.

Figure 2I:
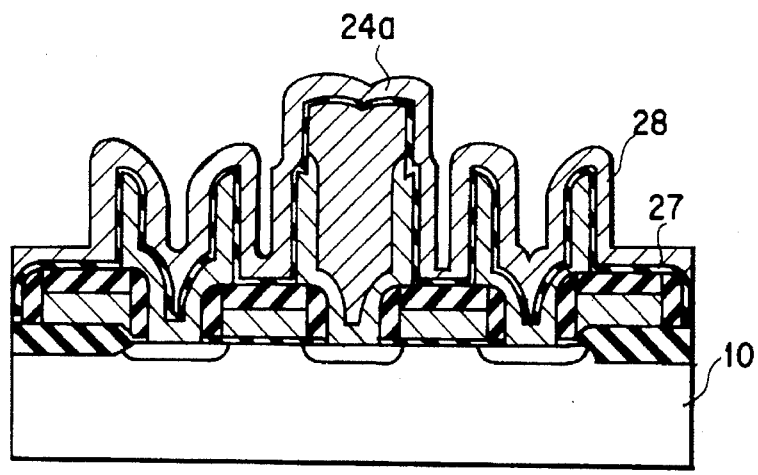

As shown in FIG. 2I, a capacitor dielectric film 27 and a fourth polycrystalline silicon film 28, using as a plate electrode, were deposited, and p-type doping was performed. Thereafter, as shown in FIG. 2J, a resist 29 was coated on the entire surface. Thereafter, a third bit line contact hole 30 was formed by use of lithography, and the fourth polycrystalline silicon film 28 was removed by means of CDE (chemical dry etching), and the resist 29 was removed, so that the plate electrode 28 was completed. At this time, seeing from the upper position, the plate electrode 28 is shaped like one plate in which only the bit line contact portion is opened so that the structure, which is suitable for obtaining a fixed potential of the plate electrode, is formed.

As shown in FIG. 2K, a third interlayer insulating film 31 was deposited. Thereafter, the insulating film 31 and the capacitor dielectric film 27 were etched back by means of CMP (chemical mechanical polishing) until the upper portion of the conductive material 24a was exposed. As a result, the surface of the insulating film 31 was flatten to be the same level as the conductive material 24a. Then, the surface of the conductive material 24a is used as a second bit line contact area 6.

Thereafter, a bit line 33 was formed to be electrically connected to the conductive material 24a, so that the memory cell having the structure shown in FIG. 1 was obtained. By the above-mentioned process, the upper surface of the plug electrode can be formed to be higher than the upper surface of the plate electrode. Due to this, the bit line contact can be extremely easily formed, and the problems of decrease in capacitor and increase in resistance of the plate electrode can be avoided.

Figure 3:
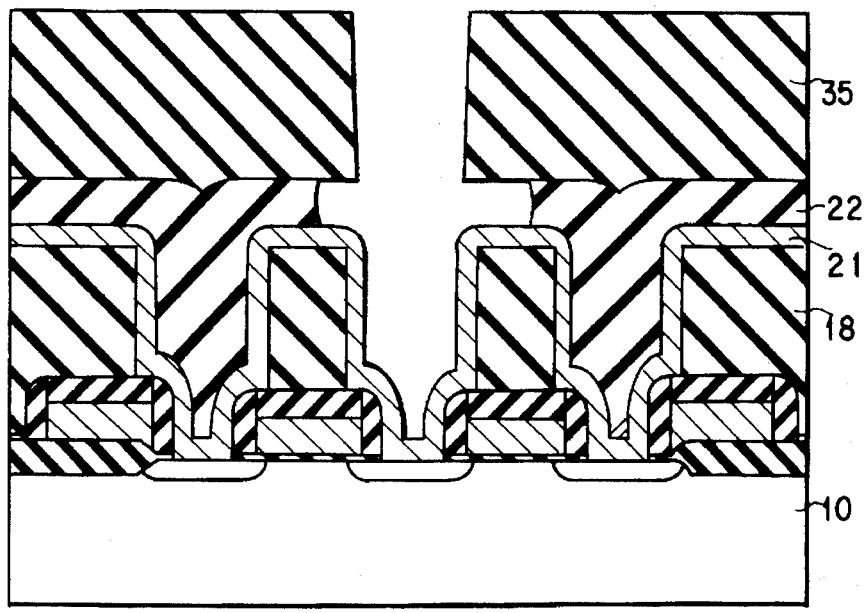
FIG. 3 is a cross sectional view showing a modification of the manufacturing process of the first embodiment.

In FIG. 2D, the opening of the second interlayer insulating film 22 was formed by use of RIE. However, as shown in FIG. 3, the surface area of the upper surface of the plug electrode can be enlarged by means of isotropic etching such as wet etching. In FIG. 3, reference numeral 35 shows etching resist.

Second Embodiment

Figure 4:
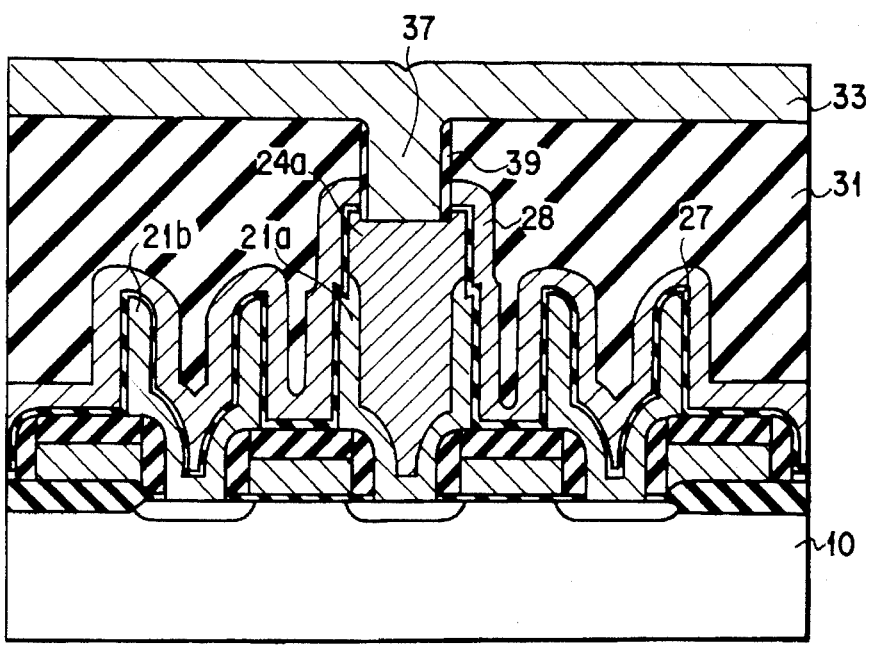
FIG. 4 is a cross sectional view taken along a bit line of a DRAM cell of a second embodiment of the present invention.

FIG. 4 is a cross sectional view showing the memory cell structure of the DRAM of the second embodiment of the present invention. The basic structure of this embodiment is the same as the first embodiment. However, in this embodiment, the conductive material 24a is first formed. Then, the capacitor dielectric film 27, the plate electrode 28, and the interlayer insulating film 31 are sequentially formed. Then, as shown in FIG. 4, these multi-layer films are processed on the plug electrode to be opened by means of RIE, so that an insulating film 39 is formed in a side wall of the bit line contact hole 37. Thereafter, the bit line 33 is deposited thereon, and the bit line contact hole 37 is buried, whereby the upper surface of the conductive material 24a and the second bit line contact are formed. The plate electrode 28 and a short contact path of the bit line 33 are insulated from each other by an insulating film 39. According to the structure of this embodiment, even if material, which cannot obtain a sufficient etching rate difference to the polycrystalline silicon of the conductive material 24a, is used in the plate electrode 28, a favorable bit line contact can be obtained.

Third Embodiment

Figure 5:
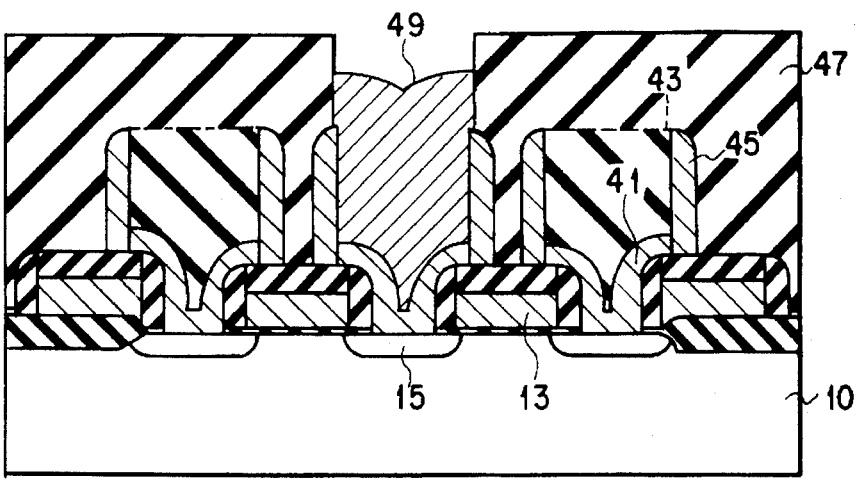
FIG. 5 is a cross sectional view taken along a bit line of a DRAM cell of a third embodiment of the present invention, and shows a step in which the formation of a plug electrode is ended.

FIG. 5 is a cross sectional view showing the memory cell structure of the DRAM of the third embodiment of the present invention. In the above first and second embodiments, as a manufacturing method of the cylindrical storage node electrode, there was used the method in which the polycrystalline silicon film is left in the inner wall of the contact hole. In the third embodiment, there is shown a bit line plug forming method in which the polycrystalline silicon is left around the cylindrical insulating material.

FIGS. 6A to 6C are cross sectional views showing the plug forming method stepwise. First, as shown in FIG. 6A, after the storage node contact area 15b and the bit line contact area 15a were formed, a second polycrystalline silicon film 41 is deposited, and n-type doping was performed. Moreover, after an insulating film 43, serving as a core of a cylindrical capacitor, was deposited, the insulating film 43 and the second polycrystalline silicon film 41 were processed to be a cylindrical or rectangular shape by means of lithography and RIE. Next, a third polycrystalline silicon film 45 was deposited on the entire surface, and n-type doping was performed. Thereafter, the third polycrystalline silicon film 45 was cylindrically left on the side wall by use of RIE, so that the storage node electrode was completed (FIG. 6B).

Moreover, as shown in FIG. 6C, a first interlayer insulating film 47 was deposited, the bit line contact hole was formed, a polysilicon film was deposited thereon, and etched back. Then, similar to the first embodiment, a conductive material 49 was left in the side of the the bit line contact hole. Thereby, the shape shown in FIG. 5 was completed. Thereafter, the first interlayer insulating film 47 was removed, and the capacitor dielectric film and the plate electrode were formed, similar to the first embodiment.

Figure 9:
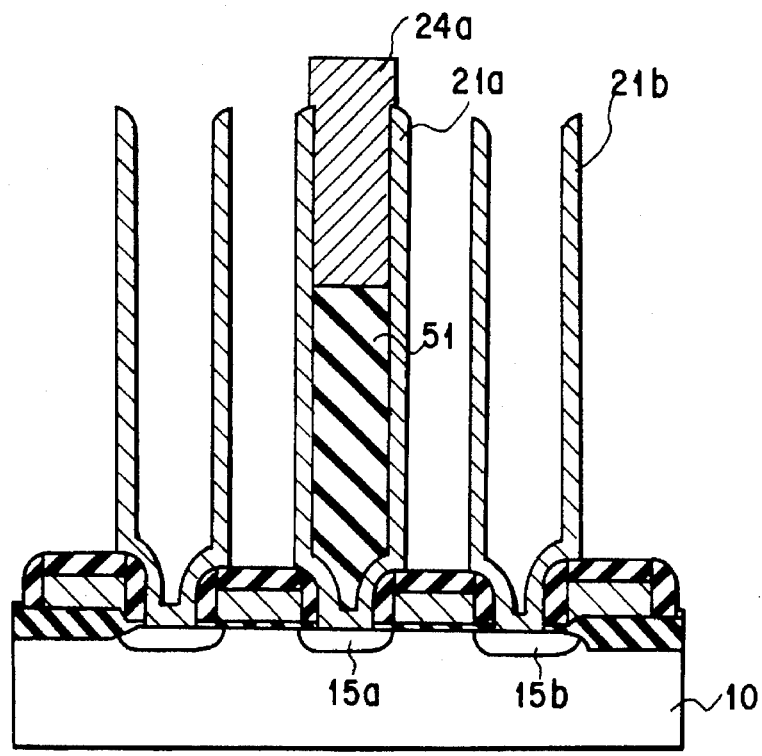
Figure 10:
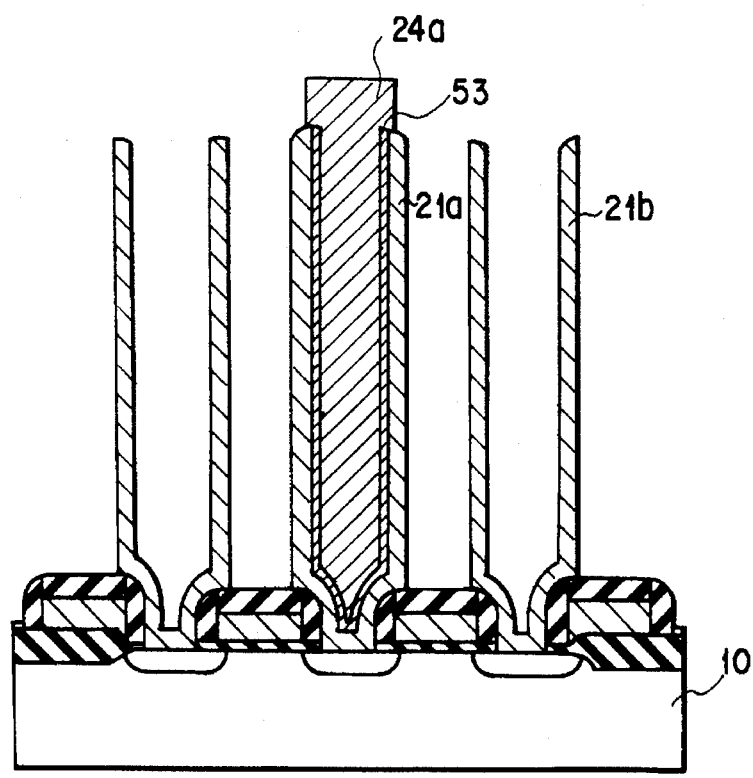

The above explained three embodiments of the DRAM memory cell using the cylindrical stacked capacitor. Various modifications can be considered. For example, as a modification of the first embodiment, FIG. 7 shows that the bit line plug electrode in which the conductive material 24a is buried can be formed by the same process even if an aspect ratio of the pad electrode 21a and the storage node electrode 21b is extremely large. In this case, the top surface of the conductive material 24a may be positioned to be lower than the upper end portion of the pad electrode 21a as shown in FIG. 8. Also, it is not needed that the inside of the pad electrode 21a be all buried with the conductive material 24a. As shown in FIG. 9, the lower portion may be filled with an insulation material 51, and only the upper portion may be filled with the conductive material 24a. Moreover, as conductive material 24a, there may be used metal such as W, Ti, Al, etc or a compound such as WSi, TiSi, etc, or conductive material having a layered structure other than the polycrystalline silicon film. Or, as shown in FIG. 10, after a siliside layer such as TiSi, NiSi, etc., is formed so as to line the pad electrode 21a, the conductive material 24a may be embedded therein. Thereby, resistance of the bit line can be reduced more markedly.

In the above embodiment, the storage node was cylindrically formed. However, the cross section is not always limited to be circular, and may be rectangular. Moreover, it is not needed that the entire shape be cylindrical. If at least the upper portion is cylindrically shaped, any shape may be in the scope of the invention for other portions.

Fourth Embodiment

Figure 11A:
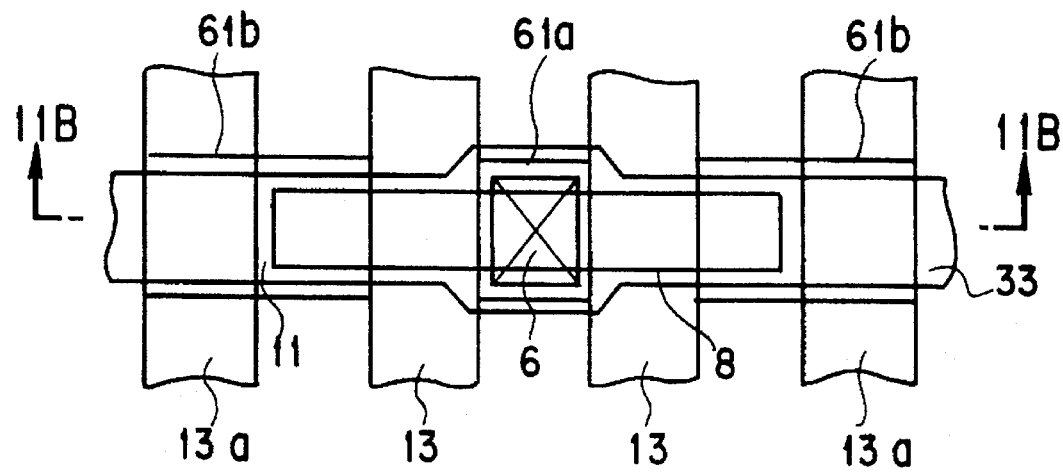
FIG. 11A is a plan view schematically showing a DRAM cell of a fourth embodiment of the present invention.
Figure 11B:
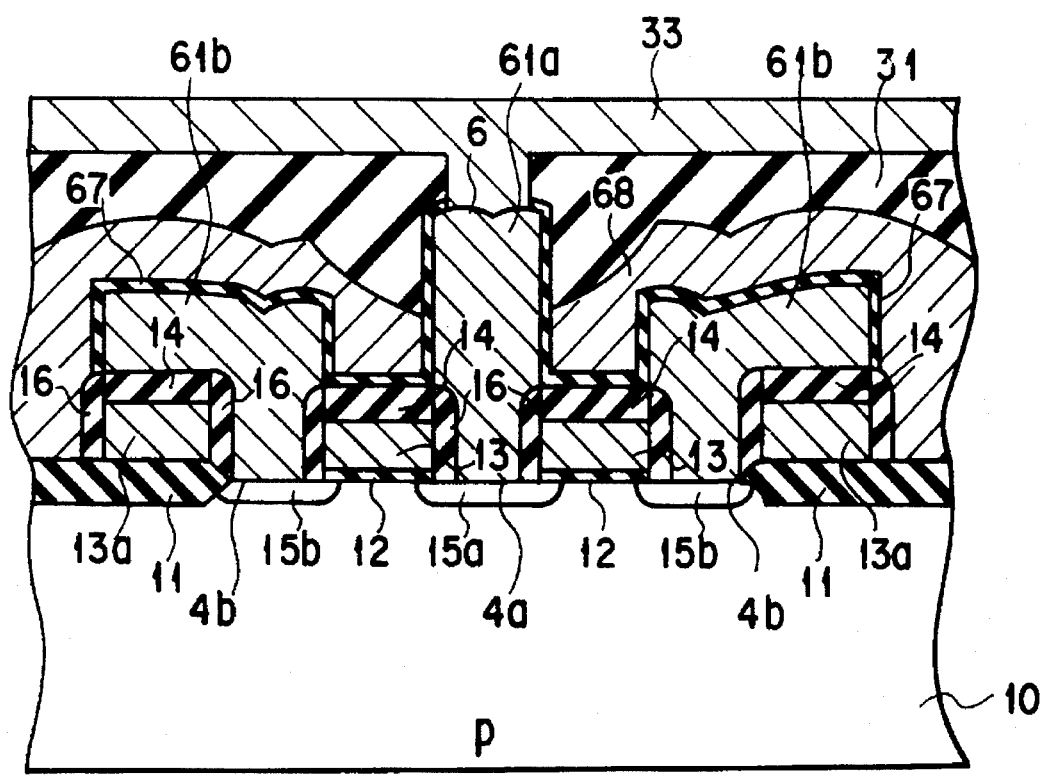
FIG. 11B is a cross sectional view taken along a line 11B—11B of FIG. 11A.

FIG. 11A is a plan view schematically showing DRAM cells for two bits adjacent to each other in a direction of a bit line in connection with the fourth embodiment of the present invention. FIG. 11B is a cross sectional view taken along a line 11B—11B. The stacked type capacitor of this embodiment is box-typed, and a cylindrical plug electrode taller than the storage node electrode 61b is formed from the beginning and used as a pad electrode 61a for bit line contact, so that the position of the bit line contact area rises. A storage node electrode 61b and the plug electrode 61a are formed at the same time, and the position of a second bit line contact area 6 is substantially highly set.

The manufacturing method of the DRAM will be explained with reference to FIGS. 12A and 12B. The element separation insulating film 11 was formed on the surface of the p-type silicon substrate 10 having resistivity of about 5 Ω·cm by a normal LOCOS. Thereafter, the gate insulation film 12, made of a silicon oxide film having a thickness of about 10 nm, was formed by means of thermal oxidization. Thereafter, the polycrystalline silicon film, serving as gate electrode material, was deposited on the entire surface to have a thickness of about 150 nm. Moreover, the insulating film such as silicon oxide film was deposited on the upper layer to have a thickness of about 100 to 300 nm by means of LPCVD (low pressure chemical vapor deposition). Then, the gate electrode 13 and the insulating film formed thereon were simultaneously patterned by use of photolithography and anisotropic etching. As the insulating film 14, a silicon nitride film or a composite film having a silicon nitride film and a silicon oxide film may be used. The silicon nitride film has high resistance to etching as compared with silicon oxide film when treatment using dilute hydrofluoric solution is performed in forming the contact and the wiring. Due to this, the use of the silicon nitride film is useful to prevent the gate electrode and the bit line contact path from being short-circuited.

The gate electrode 13 was used as a mask, and As or P ion was ion-implanted therein, so that the n-type diffusion layers 15a and 15b, serving as source and drain regions, were formed. The depth of each of the n-type diffusion layer was set to 100 nm. In order to improve dielectric withstand voltage of the gate insulating film, thermal oxidation may be performed thereafter, if necessary. Sequentially, the insulating film, formed of a silicon oxide film having a thickness of about 100 nm or less or a silicon nitride film, was deposited on the entire surface by use of CVD. Then, the entire surface was etched by means of a reactive ion etching, and the side wall insulating film 16 was left on the side surface of the gate electrode 16 in a self-aligning manner. Similar to the insulating film 14, by use of the silicon nitride film the side wall insulting film 16 can have much improved dielectric withstand voltage.

The structure corresponding to the first embodiment of FIG. 2A was obtained by the process so far. Next, the polycrystalline silicon film having a thickness of about 400 to 1000 nm was deposited on the entire surface, P or As was doped thereon, and patterned by use of lithography and reactive ion etching. As a result, the storage node electrode 61b and the plug electrode 61a were formed. Sequentially, a resist 60 with which the entire plug electrode 61a was coated was formed. Thereafter, the level of the storage node electrode 61b was made lower than that of the pad electrode 61b by use of reactive ion etching. The silicon nitride silicon film having a thickness of about 6 nm or less was deposited by means of CVD, and oxidized in a vapor atmosphere of 800° to 900° C. for 30 minutes, whereby the silicon oxide film was formed, and a capacitor dielectric film 67 having a two-layer structure of a silicon nitride film and a silicon oxide film was formed (FIG. 12B).

Moreover, the polycrystalline film was deposited thereon. After doping, a plate electrode 68 formed around the plug electrode 61a was etched by means of lithography and anisotropic etching, and patterned such that the top portion of the plug electrode 61a was exposed. The anisotropic etching was used in consideration of the points in which etching damage is low and influence on dielectric withstand voltage of the capacitor dielectric film is small. However, in a case where there is no problem of determination of dielectric withstand voltage, anisotropic etching may be used.

The capacitor dielectric film 67 was also formed on the side wall of the plug electrode 61a. As the capacitor dielectric film 67, there can be used the interlayer insulating film such as a CVD insulating film so as to ensure insulation dielectric withstand voltage between the plug electrode 61a and the plate electrode 68, so that much higher integration can be obtained.

Even in this embodiment, since the level of the plug electrode 61a is formed to be higher than that of the storage node electrode 61b, the plate electrode 68 can be left to have fully thickness in the plug electrode 61a in a self-aligning manner. Therefore, there is not such a problem that an adjacent storage node electrode is exposed by plate processing. At this time, seeing from the upper position, the plate electrode 68 is shaped like one plate in which only the bit line contact portion is opened so that the structure, which is suitable for obtaining a fixed potential of the plate electrode, is formed.

Thereafter, the interlayer insulating film 31 was formed on the entire surface, and the contact hole for the bit line contact area 6 was formed. Sequentially, the bit line 33 was formed, and connected to the plug electrode 61a at the second bit line contact area 6, so that the memory cell shown in FIG. 11B was formed. There may be formed an insulating film, which is used to prevent the bit line 33 and the plate electrode 68 from being short-circuited, on the side wall of the opening of the interlayer insulating film 31 on the bit line contact area 6 as required.

As mentioned above, the level of the plug electrode 61a of this embodiment is formed to be higher than that of the storage node electrode 6, the bit line contact can be easily formed. In the process of decreasing the level of the storage node electrode, the storage node electrode having a multi-layered structure may be provided in order to increase processing accuracy. For example, if the As-doped polycrystalline silicon is used as a lower side and the P-doped polycrystalline silicon is used as an upper side, and the boundary therebetween is detected to stop etching, thus the processing accuracy can be increased.

Fifth Embodiment

Figure 13:
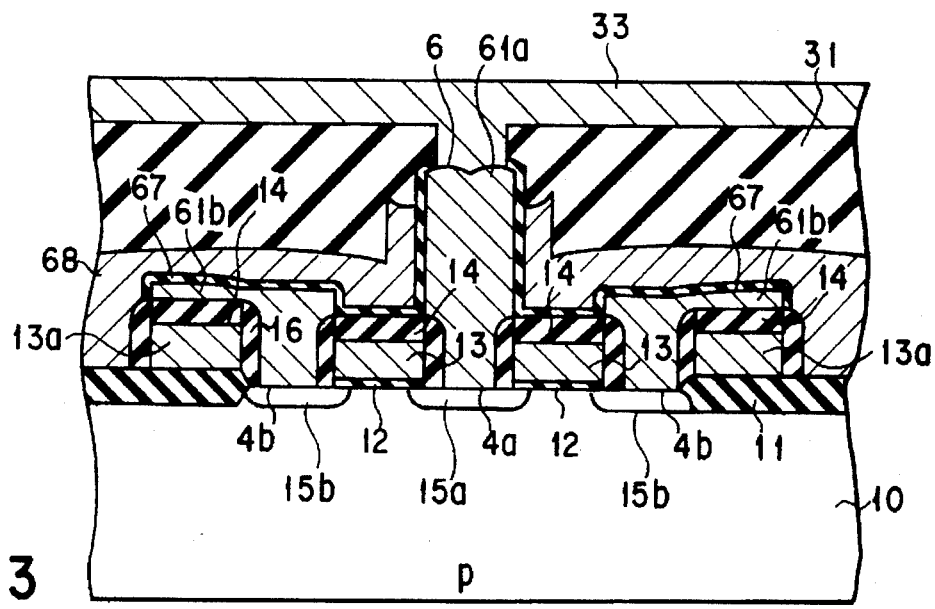
FIG. 13 is a cross sectional view taken along a bit line of a DRAM cell of a fifth embodiment of the present invention.

This embodiment shows a case in which a high dielectric constant film such as $Ta_2O_5$ is used as a capacitor dielectric film, and this embodiment is similar to the fourth embodiment in view of the structure. The plan view is omitted since it is the same as FIG. 11A, and a cross sectional view along the bit line is shown in FIG. 13. If the high dielectric constant film is used as capacitor dielectric film 67, the level of the trapezoid storage node electrode 61b can be lowered. The thickness of the storage node electrode 61b of the upper portion of the pass word line 13a can be set to, for example, about 0.1 μm. If a pad electrode, which is the same shape as the storage node electrode 61b, is formed and brought into contact with the bit line, the pad electrode would be set to have a level of 0.1 μm from the insulating film 14. When the plate electrode 68 is processed with this level, it is difficult to leave the plate electrode 68 around the pad electrode owing to over-etching. However, if the level of the plug electrode 61a is highly set as in this embodiment, this problem can be avoided. The manufacturing method is the same as the fourth embodiment.

Sixth Embodiment

Figure 14A:
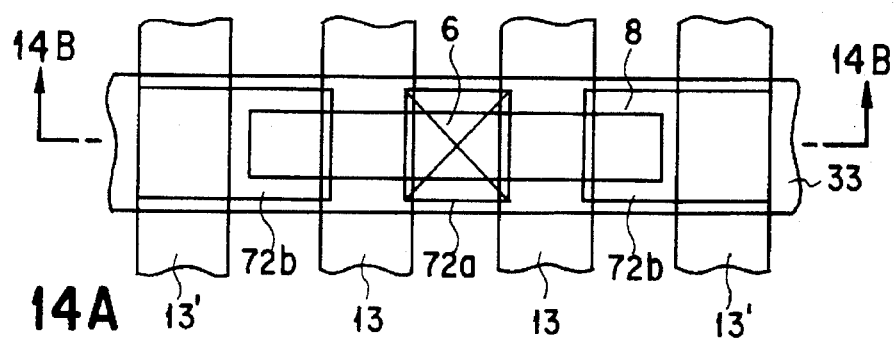
FIG. 14A is a plan view schematically showing a DRAM cell of a sixth embodiment of the present invention.
Figure 14B:
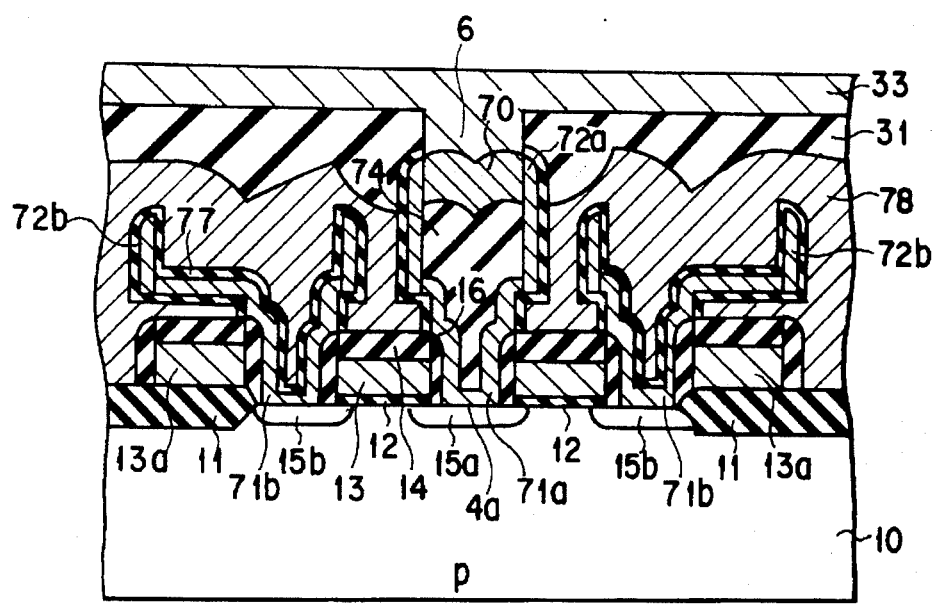
FIG. 14B is a cross sectional view taken along a line 14B—14B of FIG. 14A.

The memory cell structure of the DRAM of the sixth embodiment of the present invention will be explained with reference to FIGS. 14A and 14B. The main structure of this embodiment is similar to the fourth embodiment. However, in order to increase the capacitor area, a storage node electrode 71b is crown-shaped. The storage node electrode expands to have a flat portion covering the pass word line 13a on the field oxide film 11 and a portion 72b projecting upward at its top end. The plug electrode connected to the bit line 33 is structured to have a core 74 composed of an insulating material, and an upper layer electrode 70 in its upper surface.

The manufacturing method of the DRAM will be explained with reference to FIGS. 15A to 15D.

First, similar to the fourth embodiment, the element separation isolating area 11 was formed on the p-type semiconductor substrate 10. Thereafter, the gate insulating film 12, the gate electrode 13, and the insulating film 14 were formed. Sequentially, an interlayer insulating film 73 was formed with a stopper film 79 thereunder such that the surface of the pass word line 13a, which is formed on the field oxide film 11, is flatten. The stopper film 79 was used to protect the ground layer in removing the interlayer insulating film 73 in the later process. In a case where the interlayer insulating film 73 was formed by reflow of a BPSG film and was removed with ammonium fluoride solution, the silicon nitride film is suitable for stopper film 79.

Next, the first bit line contact area 4a and the storage node contact area 4b were formed. Thereafter, the polycrystalline silicon film having a thickness of about 100 nm was deposited on the entire surface so as to form a pad electrode 71a and a storage node electrode 71b. Then, a silicon oxide film 74 having a thickness of about 700 nm was deposited thereon by use of CVD. Moreover, a polycrystalline silicon film 70, which is used as an upper layer electrode, was deposited thereon to have a thickness of about 400 nm, and etched such that the three-layer film was left at the position where the plug electrode and the capacitor are formed (FIG. 15A). Sequentially, as shown in FIG. 15B, the plug electrode was coated with a resist 80, and the polycrystalline silicon film 70 of the capacitor was removed by use of etching.

Figure 15C:
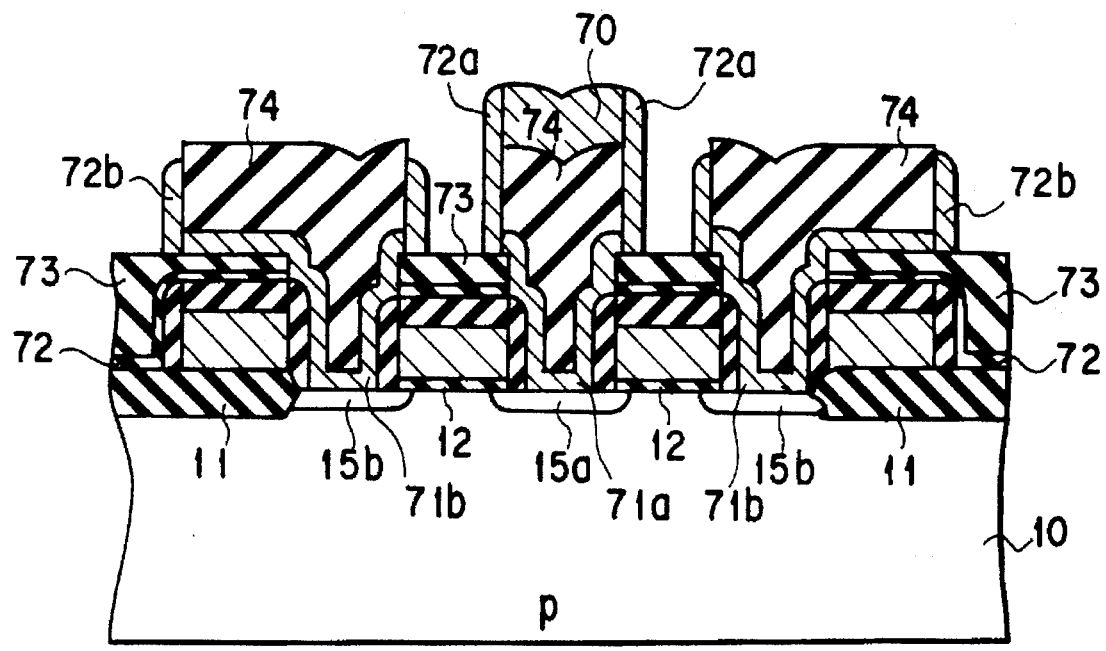

Next, the polycrystalline silicon film was deposited on the entire surface to have a thickness of about 100 nm after removing resist 80. Sequentially, the polycrystalline silicon film was etched by means of anisotropic etching, so that projection electrode 72a of the side wall of the plug electrode was left on the polycrystalline silicon film 70 and the silicon oxide film 74 by use of etching, and a projection electrode 72b of the side wall of the storage node electrode was left on the silicon oxide film 74 by use of etching (FIG. 15C).

Then, the silicon oxide film 74 and the interlayer insulating film 73 were removed with ammonium fluoride solution, and the plug electrodes (71a+72a+70) and the storage node electrodes (71b+72b) were completed. At this time, the plug electrode was formed in a state that the silicon oxide 74 was packed in the box-shaped polycrystalline silicon film.

Figure 15D:
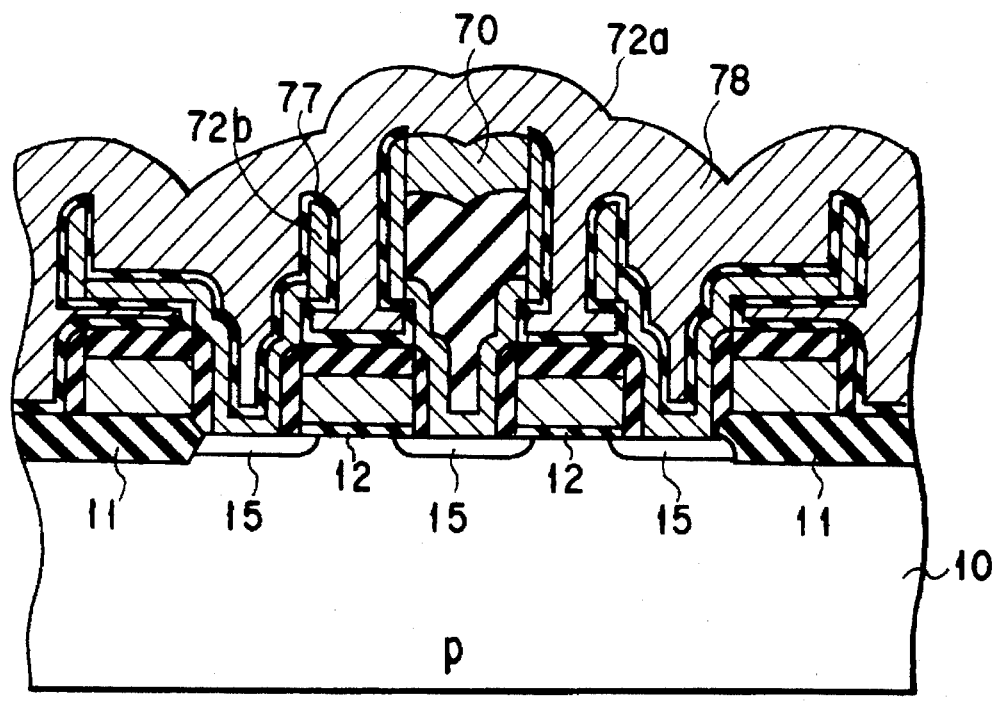

Thereafter, as shown in FIG. 15D, a capacitor dielectric film 77 and a plate electrode 78 were sequentially deposited thereon. After the plate electrode was patterned, the interlayer insulating film 31 was deposited, and the bit line contact hole was formed as shown in FIG. 14B. Sequentially, the bit line 33 was formed, so that the DRAM shown in FIGS. 14A and 14B was completed. In this embodiment, the plate electrode 78 was patterned before the interlayer insulating film 31 was formed, and the second bit line contact area was directly provided on the upper layer. However, the structure may be formed as follows. The layer of the plate electrode 78 is left on the upper electrode 70 as a stopper, and the etching is stopped at the plate electrode when opening the contact hole of the interlayer insulating film 31. Thereafter, an exposed plate electrode layer is removed and an oxide film is formed on the side wall, thereby preventing the plate electrode 78 and the bit line 33 from being short-circuited.

According to this embodiment, the bit line contact can be easily performed in addition to the point that the capacitor having large capacity can be obtained. Since the size of the storage node is enlarged by the film thickness of the projecting portion 72b, the processing margin becomes small in removing the plate electrode formed around the plug electrode by use of etching. However, since the level of the plug electrode is highly formed, the plate electrode can be easily processed such that the adjacent storage node electrode is not exposed. At this time, seeing from the upper position, the plate electrode 78 is shaped like one plate in which only the bit line contact portion is opened so that the structure, which is suitable for obtaining a fixed potential of the plate electrode, is formed. Moreover, the upper layer electrode 70 of the plug electrode has a larger contact margin than the case of the fourth embodiment since the contact area is widened by the thickness of the polycrystalline silicon 72a formed on the side wall.

Seventh Embodiment

The memory cell structure of the DRAM of the seventh embodiment will be explained as follows.

Figure 16C:
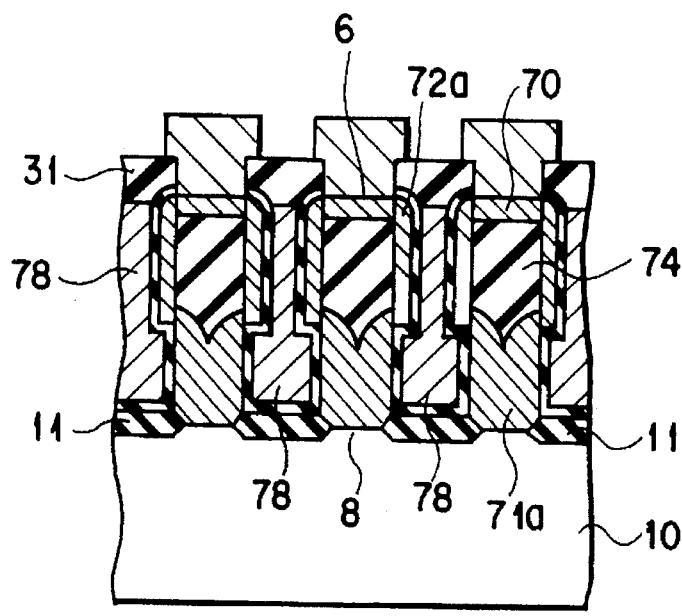
FIG. 16C is a cross sectional view taken along a line 16C—16C of FIG. 16A.

This embodiment is an example in which the basic structure of the memory cell of the sixth embodiment was applied to the NAND cell array. FIG. 16A is a plan view schematically showing the layout of the memory cell area in the form that the mask drawings are overlapped on each other. FIGS. 16B and 16C are cross sectional views taken along lines 16B—16B and 16C—16C respectively. As shown in FIG. 16B, the difference between the standard DRAM and this embodiment is that the adjacent transistors are connected in series in a state that the source and drain regions 15a and 15b are used in common. In other words, the stripe element area 8, which is separated by the element separation area 11, is formed on the p-type semiconductor substrate 10. The gate electrode 13 of the transistor is formed thereon interposing the gate insulating film 12 therebetween, and is continuously extended to be used as a word line. There are formed n-type diffusion layers 15a and 15b, serving as source and drain regions, on the surface of the substrate 10 of both sides of the gate electrode 13. The interlayer insulating films 14 and 16 are formed thereon to cover the gate electrode 13. Thereafter, the contact 4b (portion which is shown by "/" in FIG. 16A) for the storage node electrode is formed in the source and/or drain region 15b where the capacitor is formed, and the storage node electrodes 71a and 72b of the capacitor are formed as a crown-shape.

Moreover, the bit line contact 4a (portion which is shown by "x" in FIG. 16A) is formed in the source and/or drain region 15a to which the bit line connected, and the plug electrode comprising the pad electrode 71a, cylindrical electrode 72b, and the upper layer electrode 70, similar to the seventh embodiment, is formed thereon. The capacitor dielectric film 77 is formed on the entire surfaces of these electrodes, and the plate electrode 78 is formed thereon. The surrounding of the plug electrode of the plate electrode 78 is etched back such that the top portion of the plug electrode is exposed. The bit line contact hole is formed on the interlayer insulating film 31 formed on the entire surface, and the capacitor dielectric film 77 of the upper portion of the plug electrode is removed, so that the second bit line contact area 6 is formed. Then, the bit line 33 is deposited thereon.

According to this embodiment, four memory cells are connected in series, the fifth electrode counted from the bit line contact area 4a is used as a separation word line 13b for the element separation from the serial connection unit (not shown) formed on the right-hand side, so that the transistor is biased to be turned off.

By use of the mask shown by 78m in FIG. 16A, the surrounding of the plug electrode of the plate electrode 78 is etched back by use of anisotropic etching. The mask 78m is opened in a stripe form such that the upper portions of the adjacent bit line contact areas 6 are continuously etched back. However, since bit line contact areas 6 are placed at a higher position, the amount of etching back may be small. The portion between the adjacent plug electrodes is buried with the plate electrode 78 to have a sufficient thickness as shown in FIG. 16C.

Since the amount of the etching back is small, the level of the etched plate electrode can be set to be higher than the top end of the projection 72b of the storage node electrode 72b, and there occurs no case in which the storage node electrode 72b is exposed on the plate electrode 78 so that capacitance is reduced.

Figure 16D:
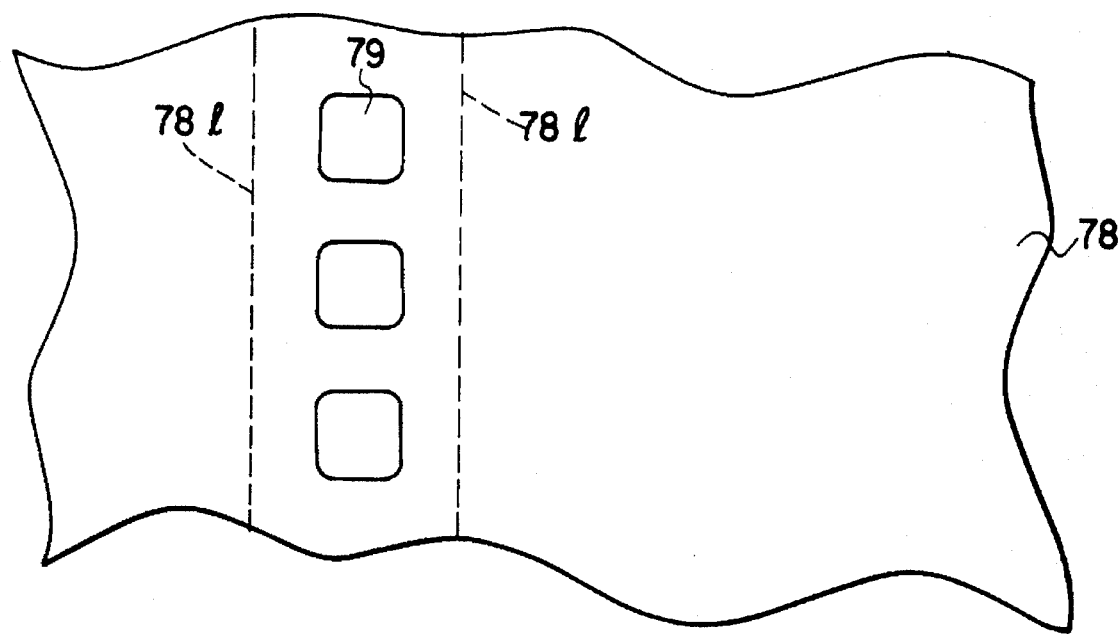
FIG. 16D is a plan view of a plate electrode of a DRAM cell of the seventh embodiment.

In the NAND-typed DRAM, the bit line connection of open bit arrangement is used, the potential of the plate electrode is preferably fixed constant at any position. In this embodiment, the connecting position of the bit line is set be high, thereby making it possible to easily process the plate electrode 78 to be continues to the entire memory cell area. If the plate electrode 78 formed around the plug electrode is thin processed, the plate electrode 78 is separated right and left or connected with an extremely thin film. If the plate electrode is separated in an island shape, the potential is different from one island to another, and this often causes the erroneous operation of the memory cell. Since the state that the plate electrode 78 is connected with an extremely thin film often increases resistance of the plate electrode, this also causes the erroneous operation. As mentioned above, according to the present invention, since the plug electrode is surrounded with the plate electrode 78 having a sufficient thickness, the above problems can be avoided. FIG. 16D is a plan view of the plate electrode corresponding to FIG. 16A, and shows the plate electrode like one plate having only an opening 79, which is formed to expose the plug electrode portion. An area, which is sandwiched by dot lines 78e, is an etched-back area. By the above-mentioned structure, the problem such as the parting of the plate electrode or the erroneous problem due to increase in resistance can be avoided. Therefore, the present invention is useful particularly to the cell structure of the NAND-DRAM.

In the NAND-type DRAM of this embodiment, the plug electrode and the memory cell structure which are similar to the sixth embodiment were used. However, it is needless to say that the NAND-type DRAM of this embodiment can be formed of the plug electrode and the memory cell structure which are explained in the first embodiment. In this case, there can be provided the NAND type DRAM in which wiring resistance of the bit line contact path is reduced more effectively.

Eighth Embodiment

The memory cell structure of the DRAM of the eighth embodiment will be explained as follows.

This embodiment provides the structure in which the dielectric withstand voltage between the plate electrode and the plug electrode is more improved than the above-mentioned embodiments. For example, as is obvious from FIG. 16B of the seventh embodiment, the plate electrode 78 and the side surface electrode 72a of the plug electrode are insulated by the capacitor dielectric film 77. An edge is formed on the etched back surface of the plate electrode 78 at an opposing position to the side surface electrode 72a interposing the capacitor dielectric film 77 therebetween. Since an electric field tends to easily concentrate on this kind of edge, there is possibility that deterioration of dielectric withstand voltage will occur in this edge. This embodiment reinforces this point.

This embodiment also relates to the NAND-type DRAM memory cell. The plan view is omitted since it is the same as FIG. 16A. FIG. 17B is a cross sectional view of the bit line contact portion in a direction perpendicular to the bit line. In the bit line connecting structure of this embodiment, if a vertical conductive section between the horizontal portion of the bit line 33 and the first bit line contact area 4a is defined as a bit line contact path 33p, the bit line contact path 33p comprises a plug 81a, which is formed on the bit line contact area 4a, and a bit line short contact path 33p', which connects the plug electrode 81a to the bit line 33. In other words, on the bit line contact area 4a, there is formed the plug electrode 81a which is formed in the same layer as the storage node electrode 81b at the same time. Then, the first bit line contact is formed therebetween. Moreover, an insulting film 85 is mounted on the plug electrode 81a such that the edge of a plate electrode 88 is positioned at the side surface of the insulation film 85 interposing a capacitor dielectric film 87 therebetween. The central portion of the insulating film 85 is opened, and the bit line short contact path 33p', which is perpendicularly branched from the bit line 33, makes the second bit line contact with the upper surface of the plug electrode 81a.

At this time, the distance between the bit line short contact path 33p' and the edge of the plate electrode 88 can be set to be larger than the film thickness of the capacitor dielectric film 87. Due to this, dielectric withstand voltage can be largely improved as compared with the case of one capacitor dielectric film, and deterioration of dielectric withstand voltage in the edge portion can be prevented. Also, the larger film thickness of the vertical direction of the insulating film 85 is, the wider margin can be increased when the etch-back processing of a plate electrode 88 is performed.

The surrounding of the bit line contact path 33p of the plate electrode 88 is lowered similar to the seventh embodiment. However, the edge portion of the surface of the plate electrode 88 comes in contact with the bit line short contact path 33p' interposing the capacitor dielectric film 87 and the insulating film 85 therebetween at the upper portion than the plug electrode 81a, that is, higher position than the storage node electrode 81b. Due to this, no problem occurs in view of the dielectric withstand voltage. In addition, the film thickness around the bit line contact path 33p of the plate electrode 88 can be fully ensured. Therefore, seeing from the upper position, the plate electrode 88 is shaped like one plate as shown in FIG. 16D, and the plate electrode 88 having low wiring resistance can be realized. The position of the second bit line contact area 6 of this embodiment is lower than the position of the seventh embodiment. However, according to the present invention, there can be obtained the structure in which the plug electrode 81a can be easily manufactured and the insulation with the plate electrode is improved.

Figure 18A:
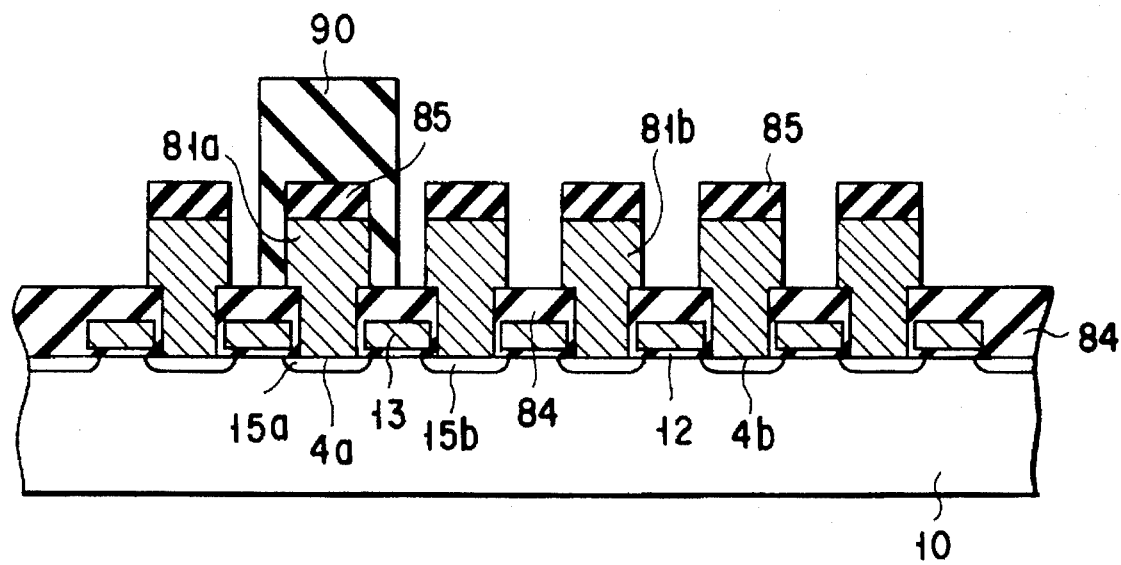
FIGS. 18A and 18B are views showing a manufacturing process of the eighth embodiment.
Figure 18B:
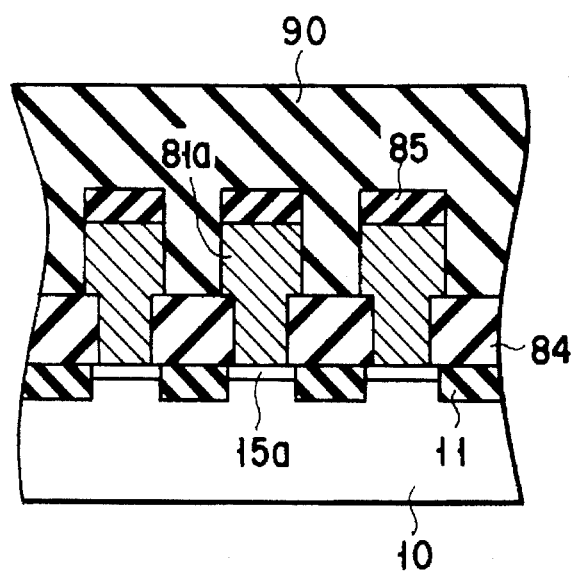

FIGS. 18A and 18B are views for explaining the manufacturing method of this embodiment. FIG. 18A is a cross sectional view along the bit line, and FIG. 18B is a cross sectional view of the bit line contact portion in a direction perpendicular to the bit line. First, the element separation area 11 was formed on the surface of the p-type silicon substrate 10 by the trench separation. Thereafter, the gate insulating film 12 was formed thereon by means of thermal oxidation. Thereafter, the gate electrode 13 was formed by use of the polycrystalline silicon film. Then, the gate electrode 13 was used as a mask, and As or P-ion was ion-implanted thereto, and the n-type diffusion areas 15a and 15b, serving as the source and drain regions, were formed, and the array of the MOS transistors connected in series was structured in the form that the source and drain regions were used in common.

Thereafter, the interlayer insulating film 84, formed of the silicon oxide layer, was deposited on the entire surface. The interlayer insulating film 82 on the n-type diffusion areas 15a and 15b was removed by reactive ion etching (RIE). Then, the first bit line contact area 4a, and the storage node electrode contact areas 4b for forming the capacitor were opened.

Next, the polycrystalline silicon film was deposited on the entire surface, doped with P or As, and patterned by lithography or RIE, so that the plug electrode 81a and the storage node electrode 81b were formed. Next, the insulating film 85 such as the silicon nitride film or the silicon oxide film was deposited and processed on the plug electrode 81a and the storage node electrode 81b by CVD or the like, and the the insulating film 85 on the storage node electrode 81b was selectively removed by use of a resist pattern for protecting only the plug electrode 81a. Thereafter, the resist pattern 90 was removed, the capacitor dielectric film 87 and the plate electrode 88 were formed sequentially, the interlayer insulating film 31 was deposited and processed to form the bit line 33 and the bit line short contact path 33p', whereby the memory cell structure of FIGS. 17A to 17C was completed.

Figure 19A:
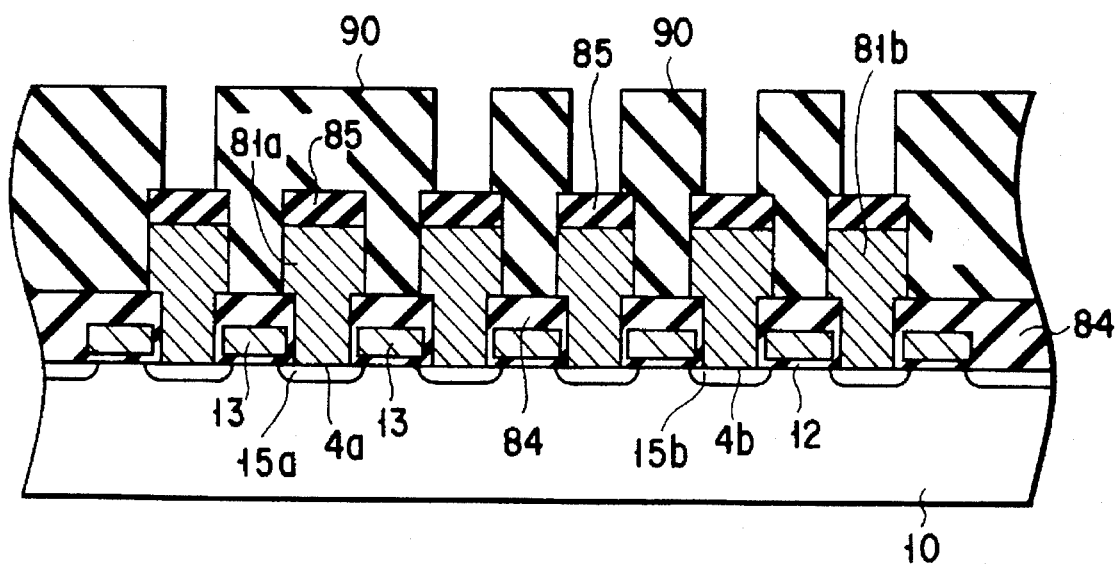
FIGS. 19A and 19B are views showing a manufacturing process of the eighth embodiment.
Figure 19B:
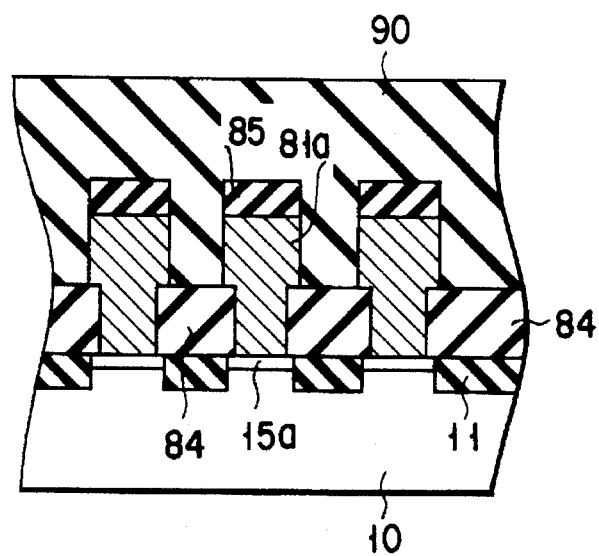

FIGS. 19A and 19B show a modification of the resist pattern 90. If the insulating film 85 on the storage node electrode 81b and the interlayer insulating film 84 are the same film, the interlayer insulating film 84 is also removed in removing the insulating film 85. Due to this, a stopper film is needed. It is of course that the stopper film may be used as at least a part of the interlayer insulating film 84. However, in FIGS. 19A and 19B, the resist pattern 90 is formed as having openings only on the insulating films 85 disposed on the storage node electrodes 81b, so that the interlayer insulating films 84 can be protected. In this case, since the resist pattern 90 partially covers the edge portions of the insulating film 85 in removing the insulating film 85, the removal of the insulating film 85 is preferably performed by use of isotropic etching. In this case, the thicker insulating film 85 is useful to the shift of the adjustment of the resist pattern 90.

Also, the insulating film 85 can be used as an antireflection film in the lithography process of the storage node electrode 81b, and various types of materials can be set to suitable thickness to meet the object.

In the above embodiment, the insulating film was provided on only the upper surface of the plug electrode 81a. However, the following processes may be performed.

For example, after processing the plug electrode, the insulting film is deposited or the oxide film is formed on the entire surface. Thereafter, the insulating film formed on the storage node electrode 81b is removed by use of the resist pattern 90 of FIGS. 18A and 18B. Thereby, the insulating film is provided not only on the upper surface but the side surface of the plug electrode 81a. In this case, the dielectric withstand voltage between the plate electrode 88 and the plug electrode 81a can be improved in not only the edge portion of the surface of the plate electrode 88 but also the whole area of the contact surface therebetween.

Ninth Embodiment

The memory cell structure of the NAND-type DRAM of the ninth embodiment will be explained. The plan view of this embodiment is omitted since it is basically the same as the seventh embodiment.

Figure 20A:
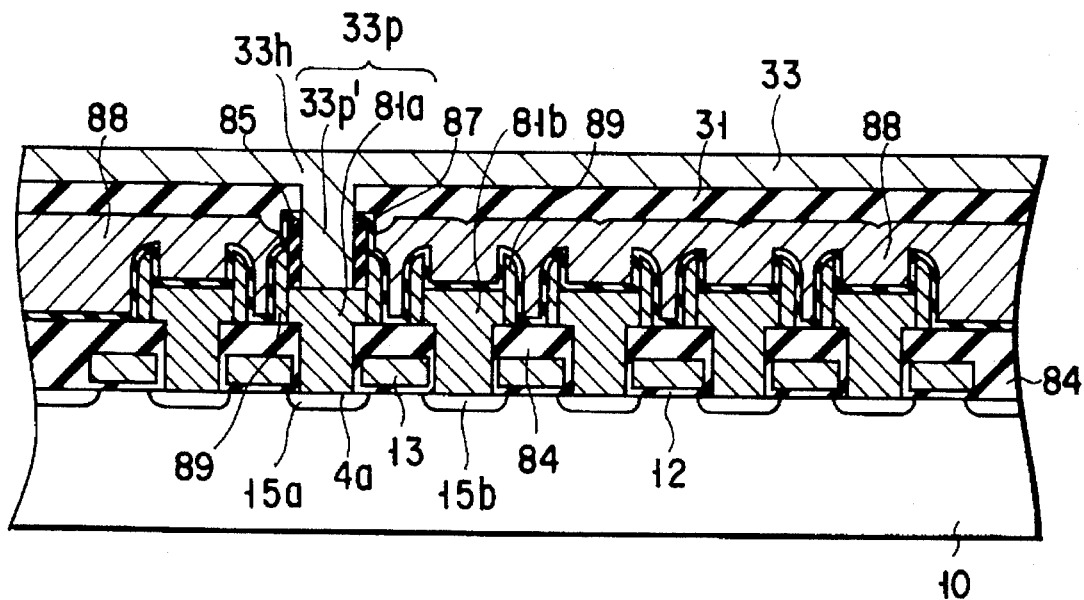
FIG. 20A is a cross sectional view taken along a bit line of an NAND type DRAM cell of a ninth embodiment of the present invention.
Figure 20B:
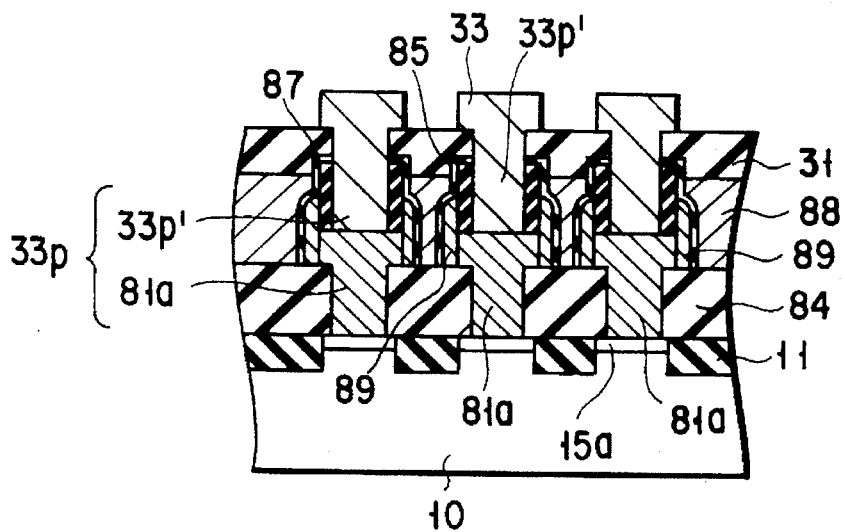
FIG. 20B is a cross sectional view of a bit line contact portion of the ninth embodiment in a direction perpendicular to the bit line.

FIG. 20A is a cross sectional view along the bit line of the memory cell array of this embodiment, and FIG. 20B is a cross sectional view of the bit line contact portion in a direction perpendicular to the bit line.

According to this embodiment, in order to increase capacitance, a cylindrical (crown-type) electrode 89 is added to the side head portion of the plug-type electrode 81b to form the storage node electrode. The cylindrical electrode 89 is also added to the plug electrode 81a of the bit line contact path 33p. The remaining structure is similar to the eighth embodiment, the insulating material 85 is formed on the plug electrode 81a, and the edge of the surface of the plate electrode 88 is provided to be formed on the side surface of the insulating film 85. Therefore, since the surface of the plate electrode 88 comes in contact with the bit line short contact path 33p', sufficient dielectric withstand voltage can be ensured. The plate electrode 88 is formed to have one plate structure as shown in FIG. 16D. The film thickness of the plate electrode 88 around the bit line contact path 33p is made sufficiently thick, so that the plate electrode 88 having low wiring resistance can be realized.

The following will explain the manufacturing method of this embodiment with reference to the drawings.

Figure 21A:
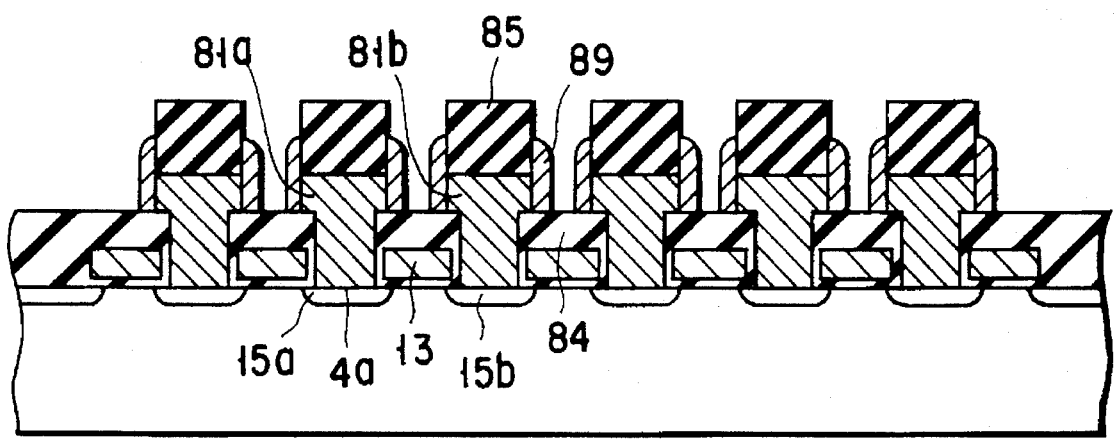
FIGS. 21A and 21B are views showing a manufacturing process of the ninth embodiment.
Figure 21B:
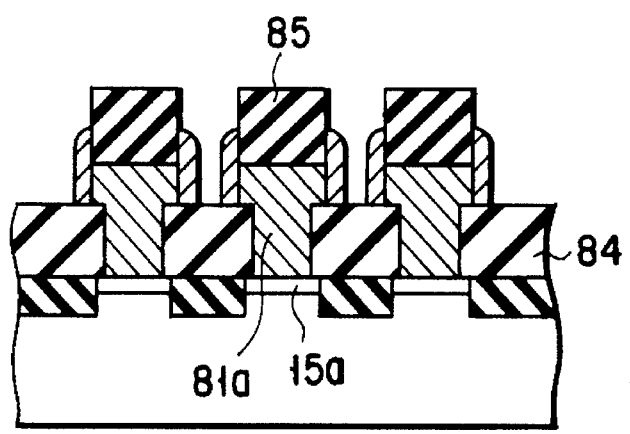

The manufacturing method of this embodiment is the same as the eighth embodiment from the process of forming the plug electrode 81a and the storage node electrode 81b to the process of forming the insulating film 85. In FIG. 21A, for example, doped polysilicon, which is the same as the storage node electrode 81b, was deposited, from the state in which no resist pattern 90 is provided. Then, the side wall electrode 89 was cylindrically left on the storage node electrode 81b, the plug electrode 81a, and the side wall of each upper portion of the insulating film 85 by use of anisotropic etching. At this time, the level of the side wall electrode 89 was formed to be lower owing to over-etching than the upper surface of the insulating film 85. Thereby, the edge of the plate electrode 88 could be made to be positioned at the side wall of the insulating film 85 in the subsequent process. Thereafter, the insulating film 85, which is formed in the portions other than the upper portion of the plug electrode 81a, was removed by the method shown in FIGS. 18A, 18B, 19A, and 19B. Thereby, the storage node electrode 81b having the cylindrical side wall electrode 89, and the plug electrode 81a having the insulating film 85 on its upper portion and the side wall electrode 89 on its top side surface were simultaneously formed. Thereafter, the process, which is from the formation of the capacitor dielectric film 87 to the formation of the bit line 33, was performed by the same way as the eighth embodiment.

Tenth Embodiment

The first to ninth embodiments explained the case in which the plug electrode is used and the second bit line contact area is formed on the upper surface of the plug electrode to make the bit line contact hole shallow. In the following embodiments, the pad, which is formed at the same time with the formation of the storage node electrode, is used, the buried bit line, which is formed at the same time with the formation of the bit line, is used as the bit line contact path, so that the memory cell structure having good insulation of the plate electrode with the bit line contact path is provided.

Figure 22A:
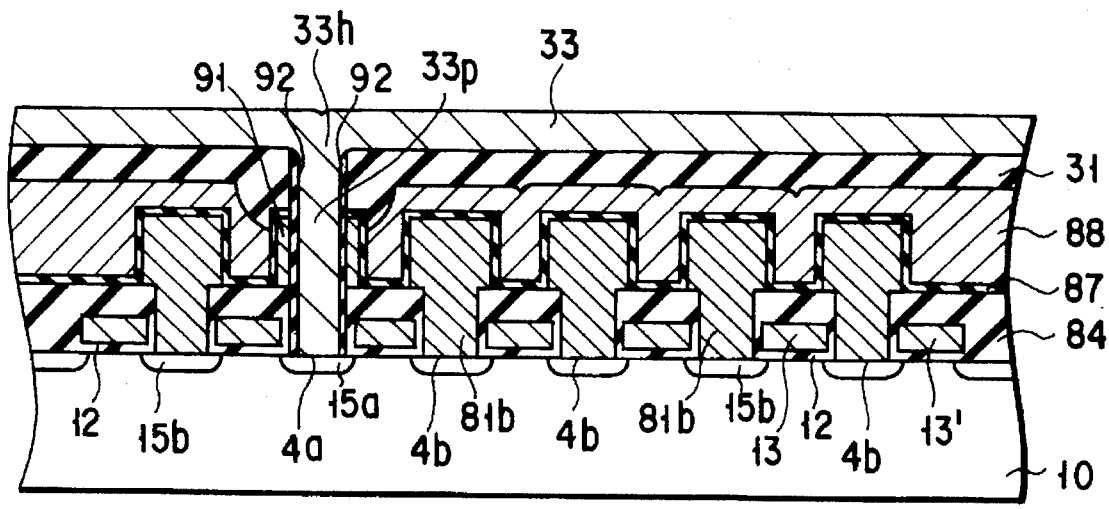
FIG. 22A is a cross sectional view taken along a bit line of an NAND type DRAM cell of a tenth embodiment of the present invention.
Figure 22B:
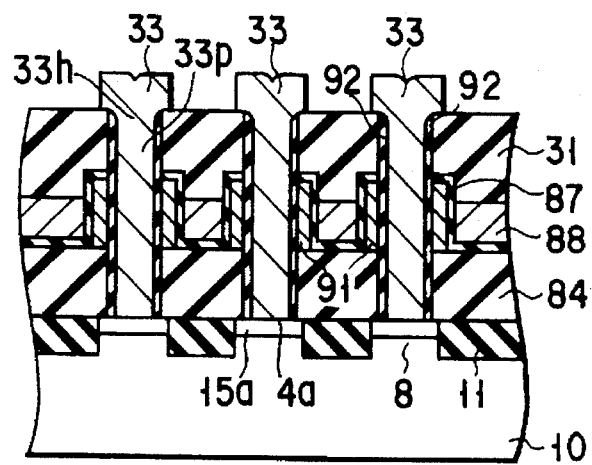
FIG. 22B is a cross sectional view of a bit line contact portion of the tenth embodiment in a direction perpendicular to the bit line.

The schematic plan view of the memory cell array of this embodiment is omitted since it is the same as FIG. 16A. FIG. 22A shows a cross sectional view along the bit line, and FIG. 22B shows a cross sectional view of the bit line contact portion in a direction perpendicular to the bit line. This embodiment is the same as the ninth embodiment from the step in which the transistor is formed on the stripe-shaped element area 8, which is separated by the trench separation area 11 and formed on the p-type semiconductor substrate 10, and to the step in which the storage node electrode 81b is formed. According to this embodiment, a pad 91 is formed on the interlayer insulating film 84 of the bit line contact portion at the same time with the formation of the storage node electrode.

Moreover, the plate electrode 88 of the capacitor is formed on the entire surface interposing the capacitor dielectric film 87 therebetween, which is formed to cover the entire element area. The interlayer insulating film 31 is formed on the plate electrode 88, and a bit line contact hole 33h passing through up to the bit line contact area 4a is formed. The inner wall of the contact hole 33h is coated with an insulating film 92. The bit line 33 is formed on the interlayer insulating film 31, and the bit line contact path 33p is also integrally formed in the contact hole 33h, which is connected to the bit line contact area 4a. Here, the bit line contact path 33p is defined as the vertical conductive member between the horizontal section of the bit line 33 and the bit line contact area 4a.

The bit line contact hole 33h is formed so as to pass through the pad 91, which is formed with the same layer as the storage node electrode 81b. On the side wall of the contact hole 33h, there is formed the side wall insulating film 92, which is made of such as a silicon nitride film. On the other hand, the outer wall of the pad 91 comes in contact with the plate electrode 88 with the capacitor dielectric insulating film 87 intervening therebetween. The surface of the plate electrode 88 around the bit line contact path 33p is etched back so as to prevent the short-circuiting. However, the amount of etching back is controlled such that the edge portion of the surface of the plate electrode 88 is positioned at the relatively upper portion of the side surface of the pad. Then, it is considered that the plate electrode of this portion has a sufficient film thickness so as to prevent electrical resistance from being increased. In the above etching back, the same kind of the mask as the mask shown by 78m of FIG. 16A is used, and isotropic etching is performed. The mask 78m is opened in a shape of stripe so as to continuously etch back the adjacent bit line contact portions. The portion between the adjacent bit line contact paths 33p is buried with the plate electrode 88 as shown in FIG. 22B to have a sufficient thickness.

According to this embodiment, the plate electrode 88 and the bit line contact path 33p are insulated and separated by two layers of the capacitor dielectric film 87 and the side wall insulating film 92. Therefore, even if the the plate electrode 88 and the pad 91 are short-circuited at the outer wall of the pad 91, the plate electrode 88 and the bit line contact path 33p are not short-circuited.

In this case, the pad 91 is not functioned as an electrode but in a floating state. However, by use of the pad 91, the surface of the plate electrode 88 is substantially flattened right after forming the plate electrode 88. Thereby, the plate electrode 88 of the area where the bit line contact path 33p is formed later is easily processed when the etching back thereto is performed in advance in order to prevent the short-circuiting. Moreover, in forming the bit line contact hole 33h, the formation of the hole can be made to be once stopped at the upper surface of the pad 91 without forming the hole deeply at one time, so that the contact hole 33 can be easily formed since the etching condition can be set to be suitable for each layer.

Figure 24A:
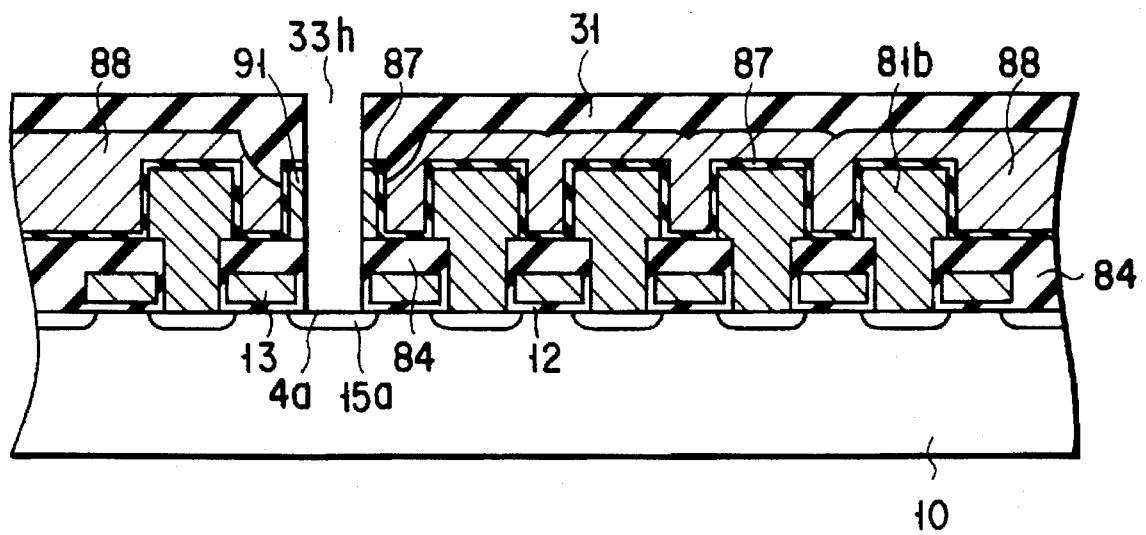
Figure 24B:
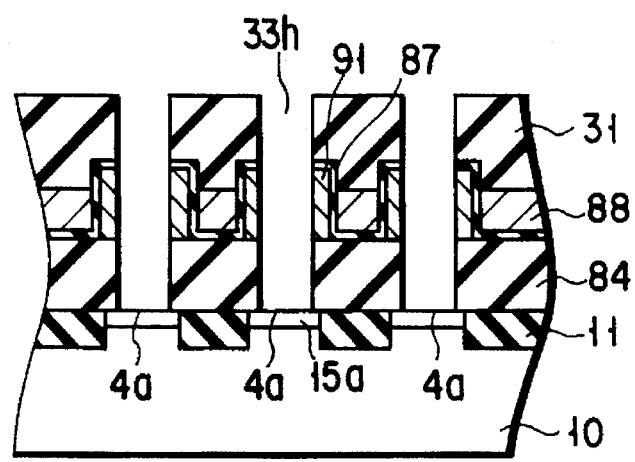

The following will explain the manufacturing method of the memory cell array with reference to FIGS. 23A, 23B, 24A, and 24B. FIGS. 23A and 24A are cross sectional views along the bit lines, and FIGS. 23B and 24B are cross sectional views of the bit line contact portions in a direction perpendicular to the bit lines, and shows the state of the intermediate stages of the process. First, the trench separation layer 11 was formed on the surface of the p-type silicon substrate 10. Thereafter, the gate insulating film 12, which is made of silicon oxide film, was formed by means of thermal oxidation. Thereafter, the polycrystalline silicon film was deposited on the entire surface, and the gate electrode 13 was formed by means of lithography and the anisotropic etching. Then, the gate electrode 13 was used as a mask, and As or P ion was ion-implanted therein, so that the n-type diffusion layers 15a and 15b, serving as source and drain regions, were formed. The array of the MOS transistors connected in series was structured in the form that the source and drain regions were used in common with adjacent transistors.

Thereafter, the interlayer insulating film 84, formed of the silicon oxide layer, was deposited on the entire surface by means of CVD. Then, the interlayer insulating film 84 on the n-type diffusion areas 15b was removed by use of reactive ion etching (RIE), and the storage node electrode contact area 4b for forming the capacitor was opened. However, in this case, the interlayer insulating film 84, which is formed on the n-type diffusion layer 15a where the bit line contact path is to be formed, was not removed, and directly left thereon.

Then, the polycrystalline silicon film was deposited on the entire surface, doped with P or As, and patterned by means of lithography and RIE to form the storage node electrode 81b and the pad 91. Then, the silicon nitride silicon film having a thickness of about 10 nm or less was deposited by means of CVD, and oxidized in a vapor atmosphere of 800° to 900° C. for 30 minutes, whereby the silicon oxide film was formed, and the capacitor dielectric film 87 having the two-layer structure of the silicon nitride film and the silicon oxide film was formed. Moreover, the polycrystalline film was deposited on the upper layer, and P was doped thereto, whereby the plate electrode 88 was formed.

Sequentially, the portion around the pad 91 of the bit line contact area of the plate electrode 88 was etched by use of lithography and isotropic etching, and patterned so that the top portion of the pad 91 was exposed (FIG. 23A). At this time, as is obvious from FIG. 23B, the portion between the adjacent pads 91 was formed to be buried with the plate electrode 88. The thickness of the plate electrode 88 is preferably thickened to be close to the surface of the pad 91 as possible. Seeing from the upper portion, the plate electrode 88 is shaped like one plate so that the portion of the pad 91 is opened similar to FIG. 16D. This is very important to reduce influence of noise exerted on the plate electrode 88. Particularly, in the structure of the open bit line system such as NAND-type DRAM, it is necessary for the potential of the plate electrode to be fixed constant without depending on the location.

After forming the interlayer insulating film 31 on the entire surface, a bit line contact hole 14h was formed as shown in FIG. 24A, and the bit line contact area 4a was formed. After forming the resist pattern by use of lithography, the interlayer insulating film 31 was etched by use of RIE to be passed through the pad 91, and the interlayer insulating film 84 was also etched by use of RIE, whereby the contact hole was formed. Since the etching condition can be set to be suitable for each layer, the formation of the contact hole was easily obtained.

Thereafter, oxidation was slightly performed, and the insulating film, made of the silicon nitride film or silicon oxide film, was deposited on the inside of the contact hole. The insulating film was etched by use of RIE, and left on the side wall of the contact hole as a side wall insulating film 92. Thereafter, the bit line 33 was deposited on the interlayer insulating film 31, burying the contact hole 33h at the same time. Thereby, the bit line contact path 33p was formed, and the memory cell structure of FIGS. 22A and 22B was completed. At this time, the pad 91 and the bit line contact path 33p were insulated and separated by the side wall insulating film 92.

The reason why the pad 91 is used in the bit line contact section is to improve processing margin of the plate electrode 88. FIGS. 25A and 25B are views explaining the reason, and show the state that a resist mask 88m is coated to process the plate electrode 88 and the patterning is performed. If the pad 91 is used, the plate electrode 88 can be processed on the pad 91, and the film thickness of the resist mask 88m is substantially evenly formed. In contrast, as shown in FIG. 25B, if no pad 91 is used, the film thickness of the resist mask 88m becomes thicker at the opening section of the plate electrode 88, and resolution of lithography is reduced. For the above reason, the pad 91 serves as an important element in forming the plate electrode 88 and that of the bit line contact hole.

Eleventh Embodiment

Figure 26A:
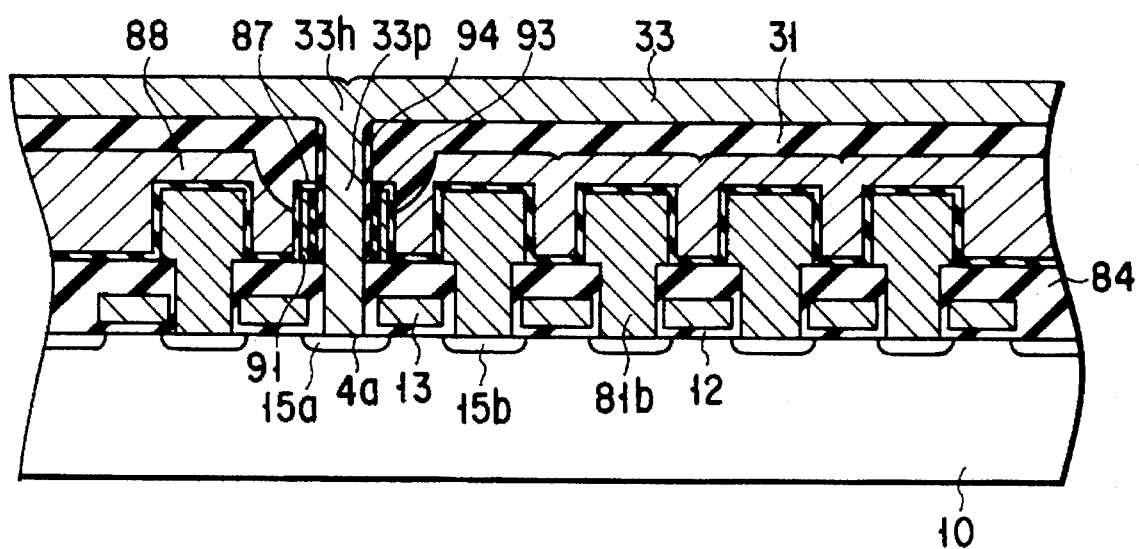
FIG. 26A is a cross sectional view taken along a bit line of an NAND type DRAM cell of a tenth embodiment of the present invention.
Figure 26B:
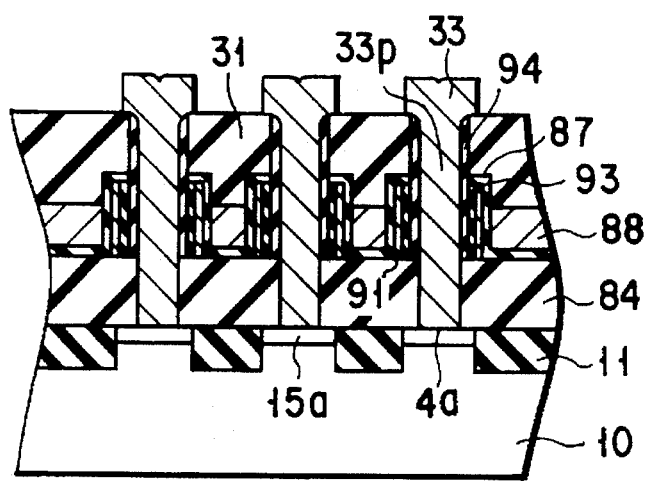
FIG. 26B is a cross sectional view of a bit line contact portion of the tenth embodiment in a direction perpendicular to the bit line.

The following will explain the memory structure of the NAND-type DRAM of the eleventh embodiment of the present invention. This embodiment is a modification of the tenth embodiment. The plan view of this embodiment is omitted since it is the same as the embodiment of FIG. 7. FIG. 26A is a cross sectional view along the bit line, FIG. 26B is a cross sectional view of the bit line contact portion perpendicular to the bit line.

Similar to the tenth embodiment, the bit line contact line hole 33h is formed to be passed through the pad 91. In the tenth embodiment, the contact hole was formed to reach the bit line contact area 4a, and the side wall insulating film 92 was formed. According to this embodiment, two kinds of side wall insulating films are formed. First, an oxide film 93 is formed on the inner side wall of the pad 91 is formed, and next a side wall film 94 is formed. If a side wall film 94 is formed of an insulating film, the bit line contact path 33p and the plate electrode 88 are insulated by three layers of the capacitor dielectric film 87, side wall insulating films 93 and 94. At this time, if sufficient dielectric withstand voltage can be obtained by the oxide film 93, the side wall film 94 is not limited to the insulating film, a conductive film such as doped polycrystalline silicon may be used. Even in this case, there exists the two-layered insulating layer including the capacitor dielectric film 10.

The above ninth to eleventh embodiments explained the case of the NAND-type DRAM. It is needless to say that the present invention can be applied to the standard DRAM since the basic memory cell structure and the bit line connecting structure are the same.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:
   a semiconductor substrate;
   a plurality of memory cells including a plurality of MOS transistors, each having a source, a drain and a gate, and a plurality of capacitors formed on said semiconductor substrate in a matrix manner, said capacitors each comprising: a storage node electrode having a cylindrical portion layered on another one of said source and said drain of each of said MOS transistors; a capacitor dielectric film formed on at least said storage node electrode; and a plate electrode formed to be opposed to at least said storage node electrode interposing said capacitor dielectric film therebetween;
   an interlayer insulating film formed on said memory cells and having a plurality of openings selectively formed;
   a plurality of plug electrodes respectively formed in said openings of said interlayer insulating film;
   a plurality of bit lines, each bit line being connected to one of said source and said drain of each of said MOS transistors through a corresponding one of said plug electrodes; and
   a plurality of word lines, each word line being said gate of each of said MOS transistors,
   said bit lines being formed on said interlayer insulating film and connected to upper surfaces of said plug electrodes through said openings so as to bury upper portions thereof respectively,
   said plug electrodes each having a pad electrode comprised of a lower side conductive member formed with a same layer as said storage node electrode and a cylindrical side wall conductive member, and an upper side conductive member formed on said pad electrode.

2. A semiconductor memory device according to claim 1, wherein an inside of said pad electrode is buried with said upper side conductive member.

3. A semiconductor memory device according to claim 1, wherein each inside of said plug electrodes is buried with an insulating material.

4. A semiconductor memory device according to claim 1, wherein a top surface of said upper side conductive member is formed to be flush with said interlayer insulting film.

5. A semiconductor memory device according to claim 1, wherein said capacitor dielectric film is formed on each side wall of said plug electrodes.

6. A semiconductor memory device according to claim 1, wherein a top surface of said upper side conductive member is positioned to be higher than a top portion of said storage node electrode.

7. A semiconductor memory device according to claim 1, wherein said transistors are formed in an array by being connected in series in a form that one of said source and said drain is used in common in adjacent ones of said transistors, said storage node electrode of each of said capacitors is connected to a corresponding one of said source and said drain of each of said transistors, and each of said bit lines is connected to a corresponding one of said source and said drain of terminal one of said transistors connected in series.

8. A semiconductor memory device comprising:
a semiconductor substrate;
a plurality of memory cells including a plurality of MOS transistors, each having a source, a drain and a gate, and a plurality of capacitors formed on said semiconductor substrate in a matrix manner, said capacitors each comprising: a storage node electrode having a cylindrical portion layered on another one of said source and said drain of each of said MOS transistors; a capacitor dielectric film formed on at least said storage node electrode; and a plate electrode formed to be opposed to at least said storage node electrode interposing said capacitor dielectric film therebetween;
an interlayer insulating film formed on said memory cells and having a plurality of openings selectively formed;
a plurality of plug electrodes respectively formed in said openings of said interlayer insulating film;
a plurality of bit lines, each bit line connected to one of said source and said drain of each of said MOS transistors through a corresponding one of said plug electrodes; and
a plurality of word lines, each word line being said gate of each of said MOS transistors,
said bit lines being formed on said interlayer insulating film and connected to top surfaces of said plug electrodes through said openings so as to bury upper portions thereof respectively,
said plug electrodes each being formed with a same layer as said storage node electrode at a bottom portion and a side wall thereof, and selectively connected to one of said source and said drain of each of said MOS transistors thereby,
wherein each top surface of said plug electrodes is positioned to be higher than a top surface of said storage node electrode.

9. A semiconductor memory device according to claim 8, wherein an inside of said plug electrode is buried with conductive material.

10. A semiconductor memory device according to claim 8, wherein an inside of said plug electrode is buried with insulating material.

11. A semiconductor memory device according to claim 8, wherein said top surface of said plug electrode is formed to be flush with said interlayer insulting film.

12. A semiconductor memory device according to claim 8, wherein said capacitor dielectric film is formed on said side wall of said plug electrode.

13. A semiconductor memory device according to claim 8, wherein said transistors are formed in an array by being connected in series in a form that one of said source and said drain is used in common in adjacent ones of said transistors, said storage node electrode of each of said capacitors is connected to a corresponding one of said source and said drain of each of said transistors, and each of said bit lines is connected to a corresponding one of said source and said drain of terminal one of said transistors connected in series.

14. A semiconductor memory device comprising:
a semiconductor substrate;
a plurality of memory cells including a plurality of MOS transistors, each having a source, a drain and a gate, and a plurality of capacitors formed on said semiconductor substrate in a matrix manner, said capacitors each comprising: a storage node electrode layered on another one of said source and said drain of each of said MOS transistors extending to be mounted on said gate electrode, a capacitor dielectric film formed on at least said storage node electrode; and a plate electrode formed to be opposed to at least said storage node electrode interposing said capacitor dielectric film therebetween;
an interlayer insulating film formed on said memory cells and having a plurality of openings selectively formed;
a plurality of bit line contact paths formed in said openings of said interlayer insulating film;
a plurality of bit lines, each bit line being connected to one of said source and said drain of each of said MOS transistors through a corresponding one of said bit line contact paths; and
a plurality of word lines, each word line being said gate of each of said MOS transistors,
said bit lines each formed on said interlayer insulating film and connected to the one of said source and said drain of each of said MOS transistors through corresponding one of said bit line contact paths formed to be passed through said interlayer insulating film and said plate electrode in an insulating manner;
said plate electrode being used in common in said plurality of said capacitors formed in a predetermined area and covering said transistors, having openings formed in an insulating manner passing said bit line contact paths, and being formed like a single plate such that a surface thereof is opposite to said bit line contact paths at the position higher than that of said storage node electrode.

15. A semiconductor memory device according to claim 14, wherein said bit line contact paths each includes a plug electrode having a conductive member formed with a same layer as the storage node.

16. A semiconductor memory device according to claim 15, wherein an inside of said plug electrode is buried with conductive material.

17. A semiconductor memory device according to claim 15, wherein an inside of said plug electrode is buried with insulating material.

18. A semiconductor memory device according to claim 15, wherein a top surface of said plug electrode is formed to be flush with said interlayer insulting film.

19. A semiconductor memory device according to claim 15, wherein said capacitor dielectric film is formed on a side wall of said plug electrode.

20. A semiconductor memory device according to claim 14, wherein said bit line contact paths and at least a surface portion of said plate electrode are insulated with at least a two-layered insulating film composed of said capacitor dielectric film and the insulating film other than said capacitor dielectric film.

21. A semiconductor memory device according to claim 14, wherein said plurality of memory cells are connected by an open bit architecture.

22. A semiconductor memory device according to claim 14, wherein said transistors are formed in an array by being connected in series in a form that one of said source and said drain is used in common in adjacent ones of said transistors, said storage node electrode of each of said capacitors is connected to a corresponding one of said source and said drain of each of said transistors, and said bit line is connected to a corresponding one of said source and said drain of terminal one of said transistors connected in series.

23. A semiconductor memory device comprising:

a semiconductor substrate;

MOS transistors each having a gate electrode formed on said semiconductor substrate in an insulating manner, a source and a drain formed on a surface of said semiconductor substrate on both sides of said gate electrode respectively;

capacitors each formed on said semiconductor substrate to be adjacent to said transistor and layered on one of said source and said drain of each of said MOS transistors, each having a storage node electrode extending to be mounted on said gate electrode, a capacitor dielectric film formed on said storage node electrode, and a plate electrode formed to be opposite to said storage node electrode interposing said capacitor dielectric film therebetween;

bit line contact areas each formed on said semiconductor substrate, and selectively formed on one of said source and said drain of each of said MOS transistors;

an interlayer insulating film formed to cover at least said transistors and said capacitors;

bit lines formed on said interlayer insulating film; and bit line contact paths formed to be passed through said interlayer insulating film and said plate electrode in an insulating manner so as to connect said bit line to said bit line contact areas respectively, wherein said bit line contact paths and at least a surface portion of said plate electrode are insulated with at least a two-layered insulating film composed of said capacitor dielectric film and an insulating film other than said capacitor dielectric film.

24. A semiconductor memory device according to claim 23, wherein said bit line contact paths includes a plug electrode having a conductive member formed with the same layer as the storage node.

25. A semiconductor memory device according to claim 24, wherein an inside of said plug electrode is buried with conductive material.

* * * * *